(12) United States Patent
Nakamura et al.

(10) Patent No.: US 7,178,233 B2
(45) Date of Patent: Feb. 20, 2007

(54) PROCESS FOR PRODUCING A COLLAPSED FILLED VIA HOLE

(75) Inventors: Toshiyuki Nakamura, Suzaka (JP); Hideto Tanaka, Suzaka (JP); Akira Ichiryu, Ageo (JP); Motonobu Takahashi, Ageo (JP); Masahito Ishii, Hino (JP); Daisuke Arai, Ageo (JP)

(73) Assignees: Mitsui Mining & Smelting Co., Ltd., Tokyo (JP); Suzuki Co., Ltd., Nagano (JP)

( * ) Notice: Subject to any disclaimer, the term of this patent is extended or adjusted under 35 U.S.C. 154(b) by 416 days.

(21) Appl. No.: 10/728,177

(22) Filed: Dec. 4, 2003

(65) Prior Publication Data

US 2004/0111882 A1 Jun. 17, 2004

Related U.S. Application Data

(62) Division of application No. 09/744,424, filed as application No. PCT/JP00/02879 on May 1, 2000, now abandoned.

(30) Foreign Application Priority Data

May 25, 1999 (JP) ............................. 1999-144275

(51) Int. Cl.
*H01K 3/10* (2006.01)
(52) U.S. Cl. .............................. 29/852; 29/846; 29/849
(58) Field of Classification Search ................ 29/846, 29/849, 852, 848
See application file for complete search history.

(56) References Cited

U.S. PATENT DOCUMENTS

| 3,037,265 | A | * | 6/1962 | Kollmeier | 29/849 |
| 3,256,589 | A | * | 6/1966 | Warren | 29/832 |
| 3,354,543 | A | * | 11/1967 | Robert et al. | 29/853 |
| 3,750,278 | A | * | 8/1973 | Baker et al. | 29/844 |
| 3,977,074 | A | * | 8/1976 | Furnival | 29/853 |
| 3,990,142 | A | * | 11/1976 | Weglin | 29/848 |
| 4,319,708 | A | * | 3/1982 | Lomerson | 228/111 |
| 4,320,572 | A | * | 3/1982 | Brower et al. | 29/832 |
| 4,394,709 | A | * | 7/1983 | Brower et al. | 361/762 |

(Continued)

FOREIGN PATENT DOCUMENTS

| JP | 59-61992 A | 4/1984 |
| JP | 62-81789 A | 4/1987 |
| JP | 6-326438 A | 11/1994 |
| JP | 08-125344 A | 5/1996 |

*Primary Examiner*—Carl J. Arbes
(74) *Attorney, Agent, or Firm*—The Webb Law Firm

(57) ABSTRACT

A process for producing a printed wiring board-forming sheet comprising a resin sheet having a through hole in the thickness direction and a metal chip inserted in the through hole. The sheet is produced by placing a resin sheet and conductive metal sheet in this order on a die base having a die hole, performing punching from the conductive metal sheet side to form a punched hole in the conductive metal sheet and to form a punched hole in the resin sheet and inserting the punched conductive metal chip in the through hole of the resin sheet whereby the front and back surfaces of the sheet can be electrically connected to each other. If the conductive metal chip is so inserted that its tip protrudes from the surface of the sheet, and if a large number of such substrates are laminated, electrical connection in the thickness direction can readily be made by virtue of the protruded conductive metal chips and a multi-layer board can be readily produced.

8 Claims, 13 Drawing Sheets

U.S. PATENT DOCUMENTS

| | | | |
|---|---|---|---|
| 4,472,238 A * | 9/1984 | Johnson | 216/18 |
| 4,501,638 A * | 2/1985 | Johnson | 216/18 |
| 4,517,050 A * | 5/1985 | Johnson et al. | 216/18 |
| 4,584,767 A * | 4/1986 | Gregory | 29/848 |
| 4,627,565 A * | 12/1986 | Lomerson | 228/107 |
| 5,019,944 A | 5/1991 | Ishii et al. | |
| 5,127,570 A * | 7/1992 | Steitz et al. | 228/103 |
| 5,584,120 A * | 12/1996 | Roberts | 29/846 |
| 5,600,103 A | 2/1997 | Odaira et al. | |
| 5,718,789 A * | 2/1998 | Gebhardt et al. | 156/154 |
| 5,736,681 A | 4/1998 | Yamamoto et al. | |
| 5,819,579 A * | 10/1998 | Roberts | 72/412 |
| 6,092,282 A * | 7/2000 | Roberts | 29/848 |
| 6,288,905 B1 | 9/2001 | Chung | |
| 6,308,406 B1 * | 10/2001 | Gill et al. | 29/849 |
| 6,392,164 B1 | 5/2002 | Iwaki et al. | |

* cited by examiner

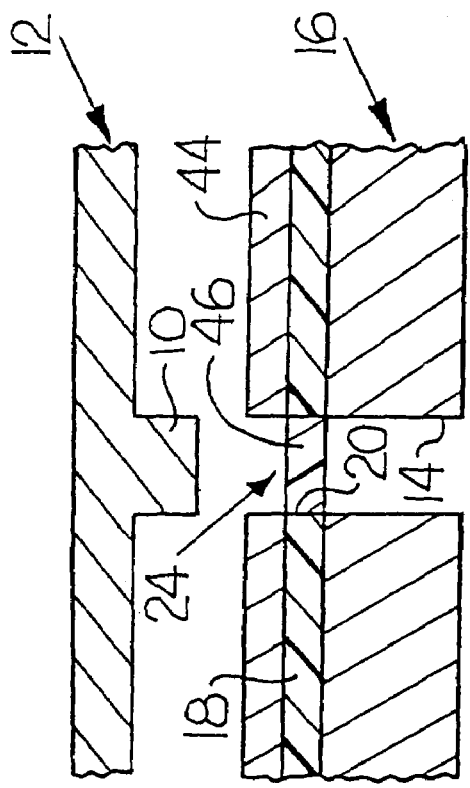
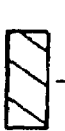
Fig. 1c
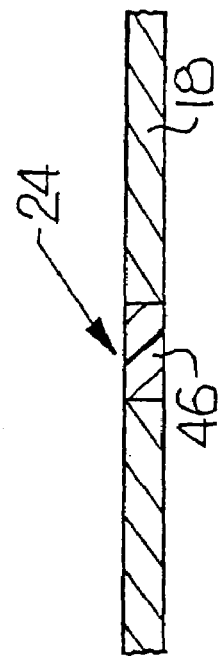
Fig. 1d
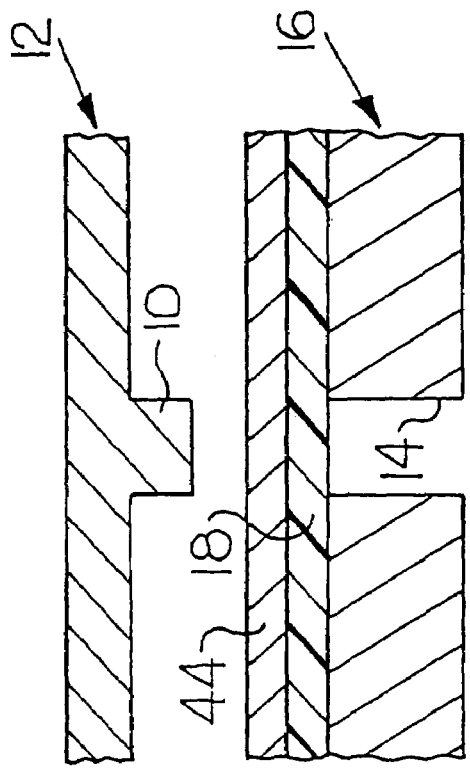
Fig. 1a
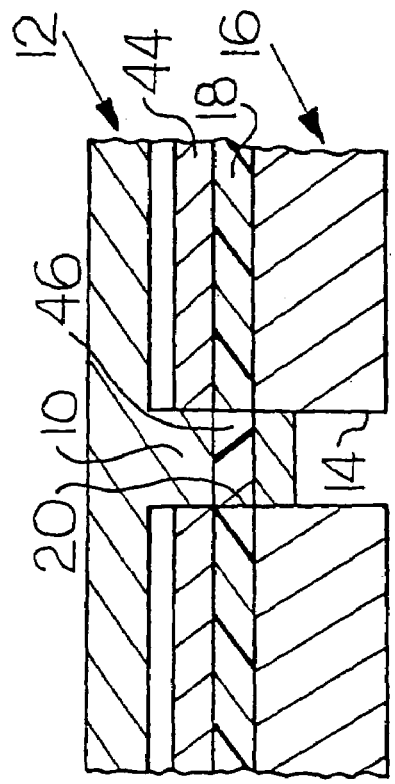
Fig. 1b

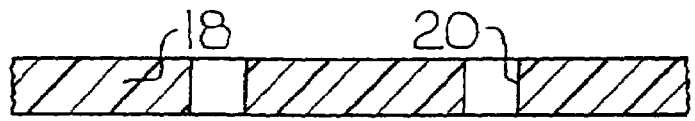
Fig. 5a
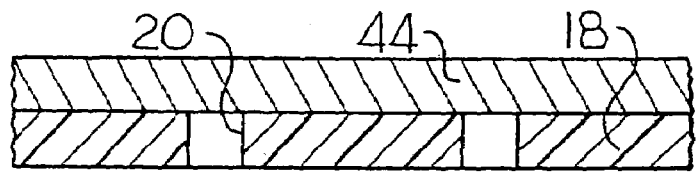
Fig. 5b
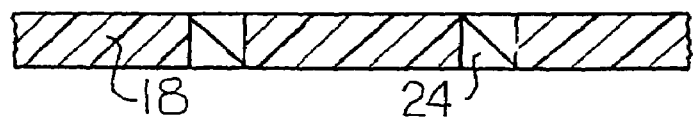
Fig. 5c
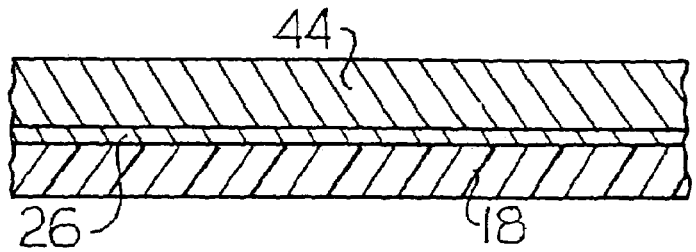
Fig. 6a
Fig. 6b
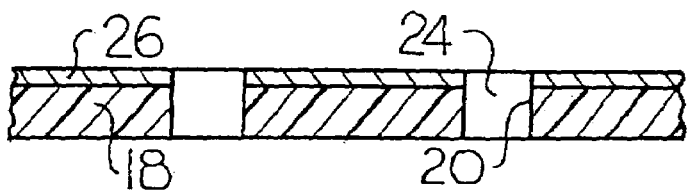
Fig. 7a
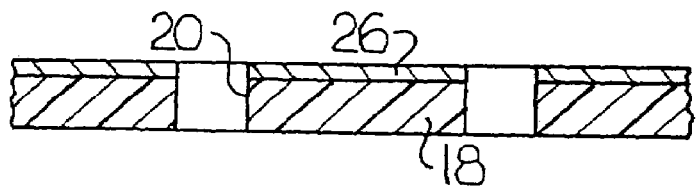
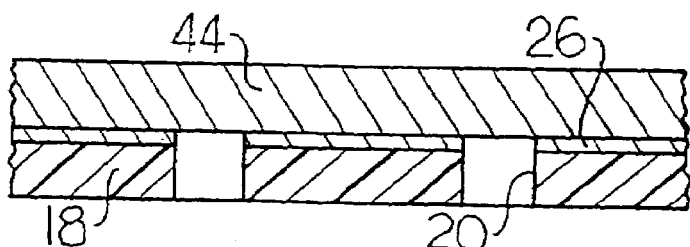
Fig. 7b
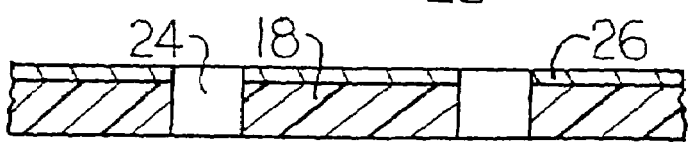
Fig. 7c

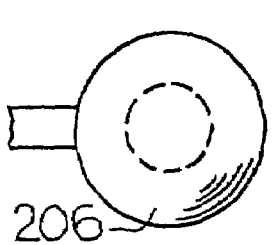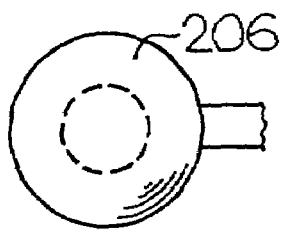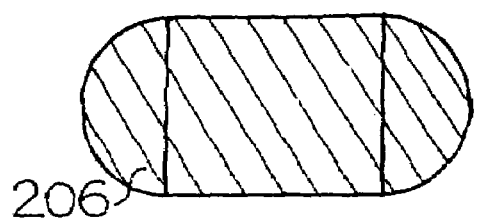
Fig. 20                    Fig. 22
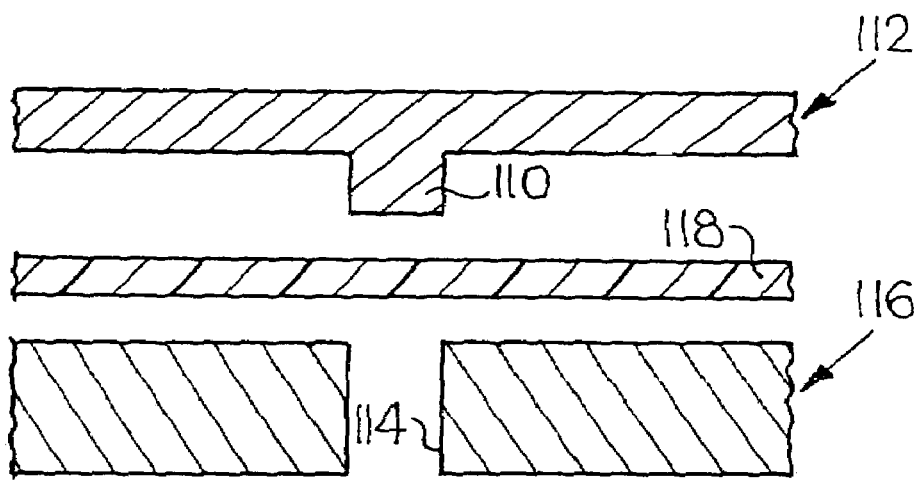
Fig. 25a
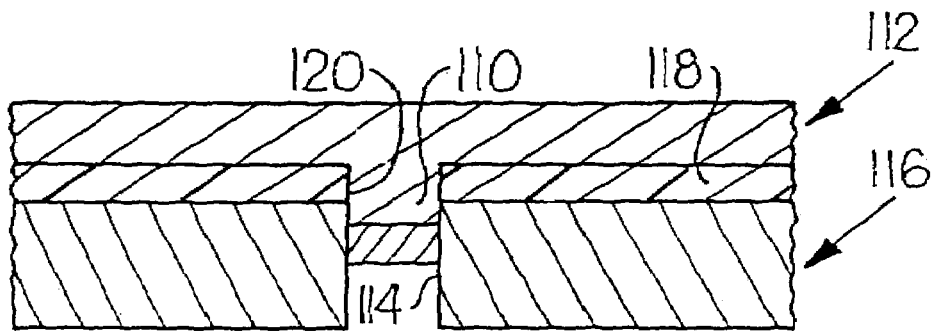
Fig. 25b
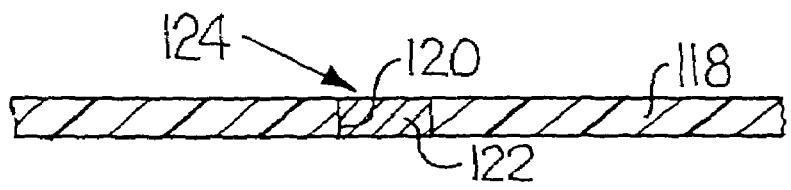
Fig. 25c

PROCESS FOR PRODUCING A COLLAPSED FILLED VIA HOLE

CROSS-REFERENCE TO RELATED APPLICATIONS

This application is a division of U.S. patent application Ser. No. 09/744,424 filed Jan. 24, 2001 now abandoned, which is a national phase filing of PCT/JP00/02879 filed May 1, 2000.

BACKGROUND OF THE INVENTION

1. Field of the Invention

The present invention relates to a printed wiring board-forming sheet, a via hole-forming method, a process for producing a resin sheet having a filled via hole, a device for forming the via hole, a TAB (tape automated bonding) tape, CSP (chip size package), BGA (ball grid array), FPC (flexible printed circuit), a so-called multi-layer board using a rigid substrate such as glass epoxy, a multi-layer printed wiring board capable of being produced by the use of a punching press, and a process for producing the same.

2. Description of Related Art

A conventional process for producing a resin sheet having a filled via hole is described below with reference to FIG. 25.

In the first place, a die having an upper part 112 provided with a punch 110 and a lower part 116 (sometimes referred to as a "base") having a die hole 114 formed at the position corresponding to the punch 110 is used, and between the upper part 112 and the lower part 116, a resin sheet 118 (thin resin sheet such as polyimide resin sheet or glass epoxy resin sheet) to be provided with a through hole is placed (FIG. 25(a)).

In the next place, the upper part 112 is lowered to allow the punch 110 to penetrate the resin sheet 118, whereby a punched hole 120 is formed in the resin sheet (FIG. 25(b)).

In the last place, a conductor paste 122 is squeezed into the punched hole 120 of the resin sheet 118 by a screen printing method using a metal mask (not shown) having an opening corresponding to the punched hole 120 and a squeegee (not shown). Thus, a via hole 124 filled with a conductor can be formed in the resin sheet 118.

Next, a process for producing a semiconductor device using the resin sheet 118 is described.

In the first place, both surfaces of the resin sheet 118 having a via hole 124 are subjected to electroless copper plating and then electrolytic copper plating to form conductor layers 126, as shown in FIG. 26(a). It is possible to form a conductive layer by means of adhesion bonding of a copper foil.

In the next place, the conductor layers 126 are patterned by photolithography, whereby a first pad 128 to be brought into contact with an electrode terminal of a semiconductor chip and a first wiring pattern 130 for connecting the first pad 128 to the upper end of the via hole 124 are formed on the upper surface of the resin sheet 118. Likewise, a second pad 132 for mounting thereon an external connecting terminal (e.g., solder ball) and a second wiring pattern 134 for connecting the second pad 132 to the lower end of the via hole 124 are formed on the lower surface of the resin sheet (FIG. 26(b)).

In the last place, a semiconductor chip 136 is mounted on the upper surface (surface for mounting semiconductor chip) of the resin sheet 118 to electrically connect an electrode pad 138 of the semiconductor chip 136 to the first pad 128, and an external connecting terminal 140 to be mounted on a mounting substrate (not shown) is set on the second pad 132 formed on the lower surface of the resin sheet 118. The external connecting terminal is, for example, a bump. A pin is also available.

Through the above process, a semiconductor device 142 using the resin sheet 118 is completed (FIG. 26(c)).

Plural resin sheets 118 each having a via hole 124 may be laminated to form a multi-layer board.

Using the insulating film (insulating substrate), a printed wiring board having wiring patterns formed on both surfaces of the insulating substrate can be produced, as described above. Examples of the printed wiring boards having wiring patterns on both surfaces include a TAB (tape automated bonding) tape, CSP (chip size package), BGA (ball grid array) and FPC (Flexible printed circuit), each of which uses a flexible substrate such as polyimide. A so-called multi-layer board using a rigid substrate such as glass epoxy is also available.

For producing the printed wiring board having conductor layers on its front and back surfaces, it is necessary to previously form a hole such as a through hole or a blind via hole at the desired position by means of a punching press, a drill or a laser beam. When a laser beam is used, it is necessary to remove so-called smears produced by a heat of the laser beam (desmearing operation).

In a process wherein the hole opened as above is filled with a conductive paste or the like using a screen printing machine to electrically connect the conductor layers on the front and back surfaces (referred to as a "conductive paste printing process" hereinafter), time-consuming steps including adhesion of a backing sheet after a hole opening in order to prevent passing of the paste into the backside, printing of the conductive paste, curing thereof and peeling of the backing sheet are required in case of the through hole. In case of the blind via hole, the diameter of an opening of a mask should be accurately determined in order to completely fill the hole, and therefore the printing machine needs to be equipped with an image recognition device or the like having high positional accuracy. On this account, the printing machine becomes expensive, and as a result, the product cost is increased.

In another process, the front and back surfaces of the insulating substrate can be electrically connected by plating on the circumferential wall of the via hole. In this case, however, it is necessary to preform electroless copper plating on the through hole or application of carbon or the like, followed by electrolytic copper plating. (This process is referred to as a "plating process" hereinafter). This process is a wet process, so that there resides a problem in disposal of waste liquid.

In the field of this art, it has been desired to improve the above processes in the cost, setting aside the reliability about the electrical connection.

For example, proposals to solve the problem have been made in Japanese Patent Laid-Open Publications No. 61992/1984 and No. 81789/1987.

In Japanese Patent Laid-Open Publication No. 61992/1984, there is disclosed a process for producing a through hole printed wiring board, which comprises forming wiring patterns, each having a conductive part covering a through hole on both surfaces of an insulating substrate, punching a hole having a diameter smaller than that of the through hole at the center of the conductive part, bringing the conductive parts on both surfaces into contact with each other and fixing the conductive parts with conductive members to electrically connect the copper foils on both surfaces to each other.

This process, however, is complicated because it includes steps of formation of a through hole, punching of a small hole and fixation with conductive members. Further, the surface smoothness becomes poor because the conductive part on one side is brought into contact with the conductive part on the other side by virtue of sagging, and besides, this process lacks reliability about the electrical connection.

In Japanese Patent Laid-Open Publication No. 81789/1987, there is disclosed a process for producing a wiring board, which comprises punching a through hole into an uncalcined ceramic substrate (green sheet), then inserting a connecting pin in the through hole, printing a conductor layer on a surface of the substrate by screen printing, and calcining the green sheet.

This process uses a green sheet as a substrate as described above, and does not use an insulating substrate such as a polyimide substrate.

By the way, a multi-layer board obtained by laminating plural printed wiring boards, each of which has a wiring pattern formed on its front and/or back surface has been used.

In Japanese Patent Laid-Open Publication No. 125344/1996, a build-up process using such a printed wiring board is disclosed. This process is described below with reference to FIGS. 27(*a*) to 27(*d*).

In the first place, an insulating substrate 401 having a first copper layer formed on one surface is subjected to masking and etching to form a desired first wiring pattern 402, and a conical first conductive bump 403 is printed on the wiring pattern 402. Above the insulating substrate 401, a first insulating adhesive layer 404 having the same shape as the insulating substrate and having a second copper layer 402*a* formed on its upper surface is located (FIG. 27(*a*)). Then, the insulating adhesive layer 404 is moved and press-bonded to the insulating substrate 401. As a result, the tip of the conical first conductive bump 403 is not only collapsed to be flattened but also allowed to penetrate the insulating adhesive layer 404 and come into contact with the second copper layer 402*a* (FIG. 27(*b*)). Thus, a first laminate 405 is produced.

In the next place, the surface of the second copper layer 402*a* of the first laminate 405 shown in FIG. 27*b* is subjected to masking and etching to form a desired second wiring pattern 402*b*, and on the wiring pattern 402*b*, a second conductive bump 403*a* having the same shape as the first conductive bump is printed. Then, a second insulating adhesive layer 404*a* having a third copper layer 402*c* formed on its upper surface is located above the first laminate 405 (FIG. 27(*c*)).

The second insulating layer 404*a* is moved downward and press-bonded to the first insulating adhesive layer 404. As a result, the tip of the conical second conductive bump 403*a* is not only collapsed to be flattened but also allowed to penetrate the second insulating adhesive layer 404*a* and come into contact with the third copper layer 402*c*. The third copper layer 402*c* is subjected to masking and etching to form a desired third wiring pattern 402*d*. Thus, a second laminate 405*a* is produced (FIG. 27(*d*)).

In the build-up process shown in FIG. 27 that is a conventional process, in order to form plural wiring patterns 402, 402*b* and 402*d* on the insulating substrate 401 through the insulating adhesive layers 404 and 404*a*, the same number of operations of printing the conductive bumps and press-bonding the insulating adhesive layers as that of the wiring patterns must be carried out. In other words, formation of a wiring pattern and printing of a conductive bump are necessary for each layer.

Moreover, with a demand for fine printed wiring boards, the wiring pattern to be formed becomes finer and finer, so that it is not easy to form a bump corresponding to the fine wiring pattern by a printing method. In addition, it is extremely burdensome to conduct the same number of printing operations as that of the wiring patterns, and in the production of a large number of products, time loss and economical loss are not negligible.

To fill the demand for fine wiring pattern printing, a printing machine equipped with an image recognition device, which has not only high printing performance but also excellent image recognition function and high positional accuracy, is necessary. Such a printing machine, however, is generally expensive, and the equipment investment becomes enormous.

In the conventional technique shown in FIG. 27, a wiring pattern layer can be formed on the lower side of the insulating substrate 401 in a manner similar to the above, but in this case, a through hole that passes through the insulating substrate 401 must be formed in order to electrically connect the wiring pattern on the upper side of the insulating substrate 401 to the wiring pattern on the lower side thereof, and this requires not only formation of the through hole but also plating on the through hole. That is, the process becomes extremely complicated.

It is an object of the present invention to provide a method for forming a via hole capable of surely attaining electrical connection between the front and back surfaces of a resin sheet.

It is another object of the present invention to provide a printed wiring board-forming sheet capable of surely attaining electrical connection between the front and back surfaces of a resin sheet.

It is a further object of the present invention to provide a device for forming the above-mentioned via hole or a filled via hole.

It is a still further object of the present invention to provide a process for producing a resin sheet having a filled via hole, in which the production steps are simplified and the filled via hole can be surely filled with a conductor.

It is a still further object of the present invention to provide a printed wiring board having high reliability about the electrical connection between the front and back surface conductive layers and capable of being produced at a low cost, and to provide a process for producing the printed wiring board.

It is a still further object of the present invention to provide a process for producing a multi-layer printed wiring board, which comprises laminating plural printed wiring boards each having wiring patterns formed on the front and back surfaces to ensure favorable electrical connection in the thickness direction, and to provide a multi-layer printed wiring board.

SUMMARY OF THE INVENTION

The printed wiring board-forming sheet of the invention comprises a resin sheet having a through hole in the thickness direction and a conductive metal chip inserted in the through hole and having a shape substantially corresponding to the through hole.

In this printed wiring board-forming sheet, the conductive metal chip is inserted in the through hole of the resin sheet, and the metal chip may be flush with the front or back surface of the resin sheet or may protrude from one or both of the front and back surfaces of the resin sheet.

A via hole of the printed wiring board-forming sheet of the invention is formed by:

a via hole-forming method which uses a punch and a die having a base with a die hole and which comprises so superposing a resin sheet and a conductive metal sheet on the base that the resin sheet is on the base side, allowing the punch to get relatively close to the base and get away relatively from the base to punch the conductive metal sheet, further punching the resin sheet by means of a chip of the conductive metal sheet thus punched, and locating the chip of the conductive metal sheet in the punched hole formed in the resin sheet, or a via hole-forming method which uses a punch and a die having a base with a die hole and which comprises so superposing on the base a resin sheet and a conductive metal sheet having a larger thickness than the resin sheet that the resin sheet is on the base side, allowing the punch to get close relatively to the base and get away relatively from the base to punch the conductive metal sheet, further punching the resin sheet by means of a chip of the conductive metal sheet thus punched, and so inserting the chip of the conductive metal sheet in the punched hole formed in the resin sheet that at least one tip of the chip protrudes from the surface of the resin sheet.

The resin sheet having a filled via hole according to the invention has various modes, and the resin sheet having a filled via hole can be produced by, for example, the following processes.

The first process is a process for producing a resin sheet having a filled via hole filled with a metal, which uses a punch and a die having a base with a die hole and which comprises:

a feeding step wherein a resin sheet and a conductive metal sheet superposed on the resin sheet are so fed onto the base that the resin sheet is on the base side, and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is located in the punched hole formed in the resin sheet.

That is, the first mode of the invention is characterized in that the process uses a punch and a die having a base with a die hole and comprises: a feeding step wherein a resin sheet and a conductive metal sheet superposed on the resin sheet are so fed onto the base that the resin sheet is on the base side; and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is located in the punched hole formed in the resin sheet.

According to the process of the first mode, hole formation and filling of the via hole can be simultaneously carried out in a single pressing operation, so that the process can be simplified and the cost can be reduced.

On one or both surfaces of the resin sheet obtained above, a wiring pattern electrically connected to the chip located in the punched hole can be formed.

The second process is a process for producing a resin sheet having a filled via hole filled with a metal, which uses a punch and a die having a base with a die hole and which comprises:

a step wherein a punched hole of a necessary pattern is formed in a resin sheet, a feeding step wherein the resin sheet having the punched hole formed therein and a conductive metal sheet superposed on the resin sheet are so fed onto the base that the resin sheet is on the base side, and a punching step wherein the punch is allowed to get close relatively to the base and get away relatively from the base to punch the conductive metal sheet, and a chip of the conductive metal sheet thus punched is located in the punched hole previously formed in the resin sheet.

That is, the second mode of the invention is characterized in that the process uses a punch and a die having a base with a die hole and comprises: a step wherein a punched hole of a necessary pattern is formed in a resin sheet; a feeding step wherein the resin sheet having the punched hole formed therein and a conductive metal sheet superposed on the resin sheet are so fed onto the base that the resin sheet is on the base side; and a punching step wherein the punch is allowed to get close relatively to the base and get away relatively from the base to punch the conductive metal sheet, and a chip of the conductive metal sheet thus punched is located in the punched hole previously formed in the resin sheet.

According to the process of the second mode, the punched hole is previously formed in the resin sheet, so that the chip can be readily and surely located in the punched hole in the second pressing operation.

The third process is a process for producing a resin sheet having a filled via hole filled with a metal, which uses a punch and a die having a base with a die hole and which comprises:

a feeding step wherein a resin sheet having a conductor layer formed on one surface and a conductive metal sheet superposed on the resin sheet are so fed onto the base that the resin sheet is on the base side, and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is so located in the punched hole formed in the resin sheet that the chip comes into contact with the conductor layer.

That is, the third mode of the invention is characterized in that the process uses a punch and a die having a base with a die hole and comprises: a feeding step wherein a resin sheet having a conductor layer formed on one surface and a conductive metal sheet superposed on the resin sheet are so fed onto the base that the resin sheet is on the base side; and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is so located in the punched hole formed in the resin sheet that the chip comes into contact with the conductor layer.

According to the process of the third mode, a resin sheet having a conductor layer on its one surface and having a filled via hole can be readily produced.

The fourth process is a process for producing a resin sheet having a filled via hole filled with a metal, which uses a punch and a die having a base with a die hole and which comprises:

a step wherein a punched hole of a necessary pattern is formed in a resin sheet having a conductor layer formed on one surface, a feeding step wherein the resin sheet having the punched hole formed therein and a conductive metal sheet superposed on the resin sheet are so fed onto the base that the resin sheet is on the base side, and a punching step wherein the punch is allowed to get close relatively to the base and get away relatively from the base to punch the conductive metal sheet, and a chip of the conductive metal sheet thus punched is so located in the punched hole previously formed in the resin sheet that the chip comes into contact with the conductor layer.

That is, the fourth mode of the invention is characterized in that the process uses a punch and a die having a base with a die hole and comprises: a step wherein a punched hole of a necessary pattern is formed in a resin sheet having a conductor layer formed on one surface; a feeding step wherein the resin sheet having the punched hole formed therein and a conductive metal sheet superposed on the resin sheet are so fed onto the base that the resin sheet is on the base side; and a punching step wherein the punch is allowed to get close relatively to the base and get away relatively from the base to punch the conductive metal sheet, and a chip of the conductive metal sheet thus punched is so located in the punched hole previously formed in the resin sheet that the chip comes into contact with the conductor layer.

According to the process of the fourth mode, a resin sheet having a conductor layer on its one surface and having a filled via hole can be readily and surely produced.

The fifth process is a process for producing a resin sheet having a filled via hole filled with a metal, which uses a punch and a die having a base with a die hole and which comprises:

a feeding step wherein a resin sheet having conductor layers formed on both surfaces and a conductive metal sheet superposed on the resin sheet are so fed onto the base that the resin sheet is on the base side, and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is so located in the punched hole formed in the resin sheet that the chip comes into contact with both the conductor layers.

That is, the fifth mode of the invention is characterized in that the process uses a punch and a die having a base with a die hole and comprises: a feeding step wherein a resin sheet having conductor layers formed on both surfaces and a conductive metal sheet superposed on the resin sheet are so fed onto the base that the resin sheet is on the base side; and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is so located in the punched hole formed in the resin sheet that the chip comes into contact with both the conductor layers.

According to the process of the fifth mode, a resin sheet having conductor layers on its both surfaces and having a filled via hole can be readily produced.

The sixth process is a process for producing a resin sheet having a filled via hole filled with a metal, which uses a punch and a die having a base with a die hole and which comprises:

a step wherein a punched hole of a necessary pattern is formed in a resin sheet having conductor layers formed on both surfaces, a feeding step wherein the resin sheet having the punched hole formed therein and a conductive metal sheet superposed on the resin sheet are so fed onto the base that the resin sheet is on the base side, and a punching step wherein the punch is allowed to get close relatively to the base and get away relatively from the base to punch the conductive metal sheet, and a chip of the conductive metal sheet thus punched is so located in the punched hole previously formed in the resin sheet that the chip comes into contact with both the conductor layers.

That is, the sixth mode of the invention is characterized in that the process uses a punch and a die having a base with a die hole and comprises: a step wherein a punched hole of a necessary pattern is formed in a resin sheet having conductor layers formed on both surfaces; a feeding step wherein the resin sheet having the punched hole formed therein and a conductive metal sheet superposed on the resin sheet are so fed onto the base that the resin sheet is on the base side; and a punching step wherein the punch is allowed to get close relatively to the base and get away relatively from the base to punch the conductive metal sheet, and a chip of the conductive metal sheet thus punched is so located in the punched hole previously formed in the resin sheet that the chip comes into contact with both the conductor layers.

According to the process of the sixth mode, a resin sheet having conductor layers on its both surfaces and having a filled via hole can be readily and surely produced.

The seventh process is a process for producing a resin sheet having a filled via hole filled with a metal, which uses a punch and a die having a base with a die hole and which comprises:

a feeding step wherein a resin sheet and a conductive metal sheet having a larger thickness than the resin sheet, said conductive metal sheet being superposed on the resin sheet, are so fed onto the base that the resin sheet is on the base side, and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is so located in the punched hole formed in the resin sheet that a tip of the chip protrudes outside the punched hole.

That is, the seventh mode of the invention is characterized in that the process uses a punch and a die having a base with a die hole and comprises: a feeding step wherein a resin sheet and a conductive metal sheet having a larger thickness than the resin sheet, said conductive metal sheet being superposed on the resin sheet, are so fed onto the base that the resin sheet is on the base side; and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is so located in the punched hole formed. in the resin sheet that a tip of the chip protrudes outside the punched hole.

According to the process of the seventh mode, the filled via hole protrudes outside the sheet, so that a resin sheet in which the protrusion of the filled via hole is employable as an external connecting terminal can be readily produced.

The eighth process is a process for producing a resin sheet having a filled via hole filled with a metal, which uses a punch and a die having a base with a die hole and which comprises:

a step wherein a punched hole of a necessary pattern is formed in a resin sheet, a feeding step wherein the resin sheet having the punched hole formed therein and a conductive metal sheet having a larger thickness than the resin sheet, said conductive metal sheet being superposed on the resin sheet, are so fed onto the base that the resin sheet is on the base side, and a punching step wherein the punch is allowed to get close relatively to the base and get away relatively from the base to punch the conductive metal sheet, and a chip of the conductive metal sheet thus punched is so located in the punched hole previously formed in the resin sheet that a tip of the chip protrudes outside the punched hole.

That is, the eighth mode of the invention is characterized in that the process uses a punch and a die having a base with a die hole and comprises: a step wherein a punched hole of a necessary pattern is formed in a resin sheet; a feeding step wherein the resin sheet having the punched hole formed therein and a conductive metal sheet having a larger thickness than the resin sheet, said conductive metal sheet being superposed on the resin sheet, are so fed onto the base that the resin sheet is on the base side; and a punching step wherein the punch is allowed to get close relatively to the base and get away relatively from the base to punch the conductive metal sheet, and a chip of the conductive metal sheet thus punched is so located in the punched hole previously formed in the resin sheet that a tip of the chip protrudes outside the punched hole.

According to the process of the eighth mode, a resin sheet having a filled via hole protruding outside the sheet can be further readily and surely produced.

The ninth process is a process for producing a resin sheet having a filled via hole filled with a metal, which uses a punch and a die having a base with a die hole and which comprises:

a feeding step wherein a resin sheet having a conductor layer formed on one surface and a conductive metal sheet having a larger thickness than the resin sheet, said conductive metal sheet being superposed on the resin sheet, are so fed onto the base that the resin sheet is on the base side, and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is so located in the punched hole formed in the resin sheet that the chip comes into contact with the conductor layer and that a tip thereof protrudes outside the punched hole.

That is, the ninth mode of the invention is characterized in that the process uses a punch and a die having a base with a die hole and comprises: a feeding step wherein a resin sheet having a conductor layer formed on one surface and a conductive metal sheet having a larger thickness than the resin sheet, said conductive metal sheet being superposed on the resin sheet, are so fed onto the base that the resin sheet is on the base side; and a punching step wherein the punch is allowed to get close relatively to the base and get away relatively from the base to punch the conductive metal sheet, then the resin sheet is punched by means of a chip of the conductive metal sheet thus punched, and the chip of the conductive metal sheet is so located in the punched hole formed in the resin sheet that the chip comes into contact with the conductor layer and that a tip thereof protrudes outside the punched hole.

According to the process of the ninth mode, a resin sheet having a filled via hole protruding outside the sheet can be further-readily and surely produced.

The tenth process is a process for producing a resin sheet having a filled via hole filled with a metal, which uses a punch and a die having a base with a die hole and which comprises:

a step wherein a punched hole of a necessary pattern is formed in a resin sheet having a conductor layer formed on one surface, a feeding step wherein the resin sheet having the punched hole formed therein and a conductive metal sheet having a larger thickness than the resin sheet, said conductive metal sheet being superposed on the resin sheet, are so fed onto the base that the resin sheet is on the base side, and a punching step wherein the punch is allowed to get close relatively to the base and get away relatively from the base to punch the conductive metal sheet, and a chip of the conductive metal sheet thus punched is so located in the punched hole previously formed in the resin sheet that the chip comes into contact with the conductor layer and that a tip thereof protrudes outside the punched hole.

That is, the tenth mode of the invention is characterized in that the process uses a punch and a die having a base with a die hole and comprises: a step wherein a punched hole of a necessary pattern is formed in a resin sheet having a conductor layer formed on one surface; a feeding step wherein the resin sheet having the punched hole formed therein and a conductive metal sheet having a larger thickness than the resin sheet, said conductive metal sheet being superposed on the resin sheet, are so fed onto the base that the resin sheet is on the base side; and a punching step wherein the punch is allowed to get close relatively to the base and get away relatively from the base to punch the conductive metal sheet, and a chip of the conductive metal sheet thus punched is so located in the punched hole previously formed in the resin sheet that the chip comes into contact with the conductor layer and that a tip thereof protrudes outside the punched hole.

According to the process of the tenth mode, a resin sheet having a filled via hole and having a conductor layer formed on one surface can be further readily produced.

In the present invention, a through hole may be previously formed in the resin sheet, or the resin sheet may be punched by a conductor chip to form a through hole. When the resin sheet has a conductor layer on its one or both surfaces according to necessity, the thickness of the conductor metal sheet may be equal to or larger than the thickness of the resin sheet having a conductor layer on its one or both surfaces.

The resin sheet having a filled via hole according to the invention comprises a resin sheet having a through hole in the thickness direction and having a conductor layer formed on at least one surface and a conductive metal chip inserted in the through hole and having a shape substantially corresponding to the through hole.

The device for forming a conductive metal chip-inserted via hole according to the invention is a device comprising a die having a base with a die hole and a punch provided at the position corresponding to the die hole and capable of vertical moving relatively to the base, wherein the die and the punch are so arranged that by placing a resin sheet and a conductive metal sheet on the base in this order and then allowing the punch to get close relatively to the base, a punched hole can be formed in the conductive metal sheet, and the moving position of the punch is so controlled that the punch is capable of stopping at such a position that a chip of the conductive metal sheet thus punched can be inserted in a punched hole formed in the resin sheet.

In this device, it is preferable that the base with a die hole is a lower part of the die and the punch is provided on an upper part of the die, said upper part being capable of getting close relatively to the lower part of the die and getting away relatively from the lower part of the die.

The moving position of the punch is so controlled that the punch is capable of stopping at such a position that the tip (lower end) of the punch and the upper surface of the resin sheet placed on the base are almost flush with each other.

In the device, the punch preferably has a first stop-position control means which serves not only to punch the conductive metal sheet placed on the resin sheet having a punched hole previously formed, said resin sheet being placed on the base, but also to stop the punch at such a position that the punched conductive metal chip can be inserted in the punched hole formed in the resin sheet, and a second stop-position control means which serves to form a punched hole in the resin sheet prior to insertion of the conductive metal chip.

In the present invention, the conductive metal sheet is preferably at least one metal sheet selected from the group consisting of a solder sheet, a copper sheet, a copper alloy sheet, and a sheet composed of a metal and a solder plating formed on the metal.

In the present invention, the resin sheet is preferably a sheet formed from an insulating resin, and the resin sheet is more preferably a sheet formed from at least one insulating resin selected from the group consisting of polyimide, polyester, polypropylene, polyphenylene sulfide, polyvinylidene chloride, EVAL, an ethylene-vinyl alcohol copolymer available from Kurary Co., Ltd., Osaka, Japan, glass epoxy and a BT resin.

The printed wiring board of the invention is a printed wiring board comprising an insulating substrate and conductor layers provided on at least both surfaces of the substrate, wherein the substrate has a through hole formed by a punching press, the through hole is filled with a conductor by a punching press, and the conductor is electrically connected to the conductor layers.

In the printed wiring board, it is preferable that the insulating substrate having a conductor layer formed on at least one of the front and back surfaces has a through hole formed in the thickness direction, the through hole is filled with a conductor by a punching press, and the conductor is electrically connected to at least a part of the conductor layer formed on at least one of the front and back surfaces of the insulating substrate.

The printed wiring board is preferably one obtained by so superposing the insulating substrate having a conductor layer on at least one of the front and back surfaces and a conductor sheet on a base having a die hole that the insulating substrate is on the base side, then punching the conductor sheet by means of a punch capable of getting close to the base and getting away from the base, further punching the insulating substrate by means of a chip of the conductor sheet thus punched to form a through hole and inserting the chip in the through hole to electrically connect the chip to at least a part of the conductor layer on at least one of the front and back surfaces of the substrate.

The printed wiring board of the invention usually has a multi-layer structure of three or more layers including the conductor layer. The conductor layer is usually formed from, for example, lead, tin, copper or an alloy containing any of these metals as a main component.

In the process for producing a printed wiring board according to the invention, it is preferable to use an insulating substrate having a through hole formed in the thickness direction and to fill the through hole with a conductor by a punching press. Further, it is preferable to form a through hole in the insulating substrate in the thickness direction and to fill the through hole with a conductor by a punching press to electrically connect the conductor to at least a part of the conductor layer.

The printed wiring board has a multi-layer structure of three or more layers including the conductor layer, and the conductor layer is preferably formed from a metal or an alloy, such as lead, tin, copper or an alloy containing any of these metals as a main component.

The printed wiring board is a printed wiring board comprising an insulating sheet having a wiring pattern formed on one or both surfaces and a conductor filled in a through hole that passes through the wiring pattern and the insulating sheet, wherein at least one end of the conductor protrudes from the aligned surface of the insulating sheet and/or the wiring pattern.

The multi-layer printed wiring board of the invention is a multi-layer printed wiring board obtained by laminating plural printed wiring boards through insulating adhesive layers and press-bonding the plural printed wiring boards together, wherein each of the plural printed wiring boards comprises an insulating sheet having a wiring pattern formed on one or both surfaces and a conductor filled in a through hole that passes through the wiring pattern and the insulating sheet, and at least one end of the conductor has a protrusion which protrudes from the aligned surface of the insulating sheet and/or the wiring pattern.

The multi-layer printed wiring board can be prepared by a process comprising:

preparing plural printed wiring boards each of which comprises an insulating sheet having a wiring pattern formed on one or both surfaces and having a through hole filled with a conductor, at least one end of said conductor protruding from the surface of the wiring pattern and/or the insulating sheet, laminating the plural printed wiring boards through insulating adhesive layers, and press-bonding the laminated plural printed wiring boards to allow the conductor protrusion of each printed wiring board to penetrate the adhesive layer and come into contact with the wiring pattern and/or a conductive material of the neighboring printed wiring board so as to make electrical connection between the neighboring wiring patters.

In the process for producing a multi-layer printed wiring board, the through hole is formed by punching.

In the process for producing a multi-layer printed wiring board, it is preferable to form the through hole by punching and to insert the conductor in the through hole by a punching press.

That is, the printed wiring board of the invention is a printed wiring board comprising an insulating sheet having a wiring pattern formed on one or both surfaces and a conductor filled in a through hole that passes through the wiring pattern and the insulating sheet, wherein at least one end of the conductor protrudes from the aligned surface of the insulating sheet and/or the wiring pattern.

When plural printed wiring boards having protrusion are laminated through insulating adhesive layers and then press-bonded, the protrusion penetrates the insulating adhesive layer and is electrically connected to the neighboring printed wiring board, whereby a multi-layer printed wiring board can be produced.

Instead of the conductive bump-printing method in the conventional build-up process, there is used in the invention a printing wiring board (unit board) wherein a through hole is formed in an insulating sheet by punching or the like at the position where a conductive material corresponding to the conventional conductive bump is to be provided, the through hole is filled with the conductive material, and at least one end of the conductive material in the through hole protrudes from the surface of the wiring pattern or the insulating sheet.

In recent years, the wiring pattern has become finer and finer, and formation of a through hole by means of punching or the like can be made more easily and more accurately than formation of a conductive bump by means of printing.

Further, if plural unit boards having protrusion are laminated and press-bonded, the protrusion penetrates the insulating adhesive layer, and thereby the wiring patterns or the conductive materials of the neighboring unit boards are electrically connected to each other. Accordingly, in a mere single operation of press-bonding of the unit boards, the unit boards are electrically connected to one another independent of the number of the unit boards, and a multi-layer printed wiring board can be easily produced.

The conductive material filled in the through hole of the unit board has not only a function of connecting the wiring patterns of the neighboring unit boards but also a function of electrically connecting the upper and lower wiring patterns of the unit board containing this conductive material. Examples of suitable conductive materials include lead, tin, copper nickel and alloys containing any of these metals as a main component, such as solder. In addition, indium or a precious metal such as gold or silver is also available.

BRIEF DESCRIPTION OF THE DRAWINGS

FIG. 1 is a group of explanatory views showing steps of the first mode.

FIG. 5 is a group of explanatory views showing steps of the second mode.

FIG. 6 is a group of explanatory views showing steps of the third mode.

FIG. 7 is a group of explanatory views showing steps of the fourth mode.

FIG. 20 is an enlarged view of a land and its vicinity on the front surface of the TAB tape.

FIG. 22 is an enlarged view of a land and its vicinity on the back surface of the TAB tape.

FIG. 24 is a group of vertical sectional views showing main points of the production of a multi-layer printed wiring board by laminating the unit boards of FIG. 23 together.

FIG. 25 is a group of explanatory views showing a conventional method for forming a filled via hole.

DETAILED DESCRIPTION OF THE INVENTION

Figure 2:
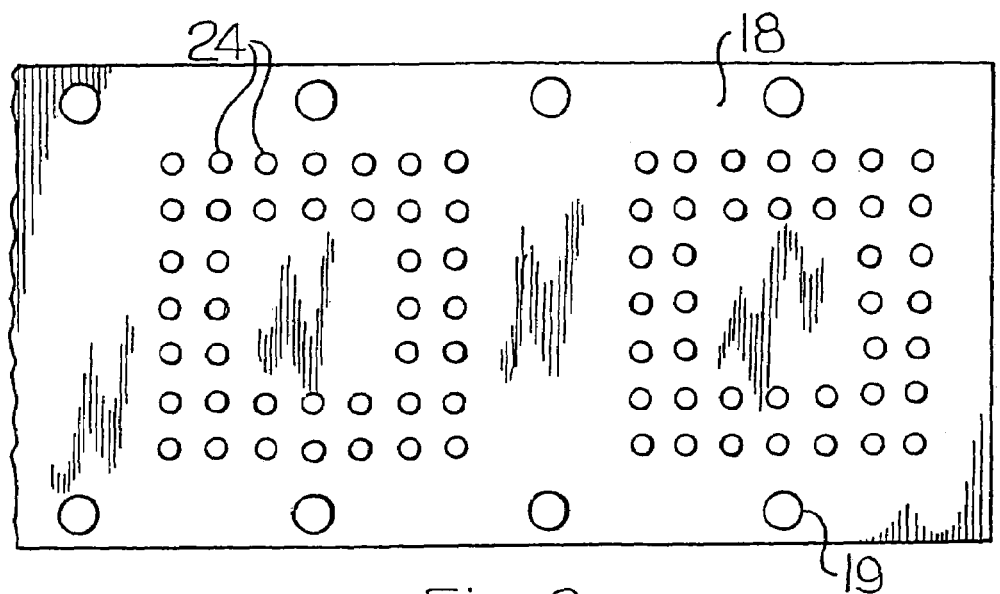
FIG. 2 is a plan view schematically showing a resin sheet having filled via holes produced.

Preferred modes of the printed wiring board-forming sheet, the via hole-forming method, the resin sheet having a filled via hole, the printed wiring board, the process for producing the printed wiring board, and the device for producing the printed wiring board according to the present invention are described in detail hereinafter with reference to the attached drawings.

First Mode

FIG. 1 shows steps of the first mode for producing a resin sheet having a filled via hole.

A die having an upper part 12 provided with a punch 10 and a lower part (base) 16 provided with a die hole at the position corresponding to the punch 10 is used. As shown in FIG. 1(a), a resin sheet 18 and a conductive metal sheet 44 which has a thickness equal to or a little larger than that of the resin sheet 18 and is superposed on the resin sheet are fed onto the lower part (base) 16 so that the resin sheet 18 is on the side of the lower part 16.

The resin sheet 18 employable herein is a sheet of polyimide, polyester, polypropylene, polyphenylene sulfide, polyvinylidene chloride, EVAL, an ethylene-vinyl alcohol copolymer available from Kurary Co., Ltd., Osaka, Japan, glass epoxy, a BT resin or the like.

The conductive metal sheet 44 employable herein is, for example, a solder sheet, a copper sheet, a copper alloy sheet or a sheet composed of a metal and a solder plating formed on the metal.

Then, the upper part 12 is lowered to punch the conductive metal sheet 44 and the resin sheet 18 by means of the punch 10, as shown in FIG. 1(b).

The stroke of the upper part 12 is controlled so that the lower end of the punch 10 descends to the position substantially coinciding with the lower surface of the conductive metal sheet 44 but descends no more.

That is, the punch 10 penetrates the conductive metal sheet 44 but does not reach the resin sheet 18.

The resin sheet 18, however, is punched by means of a chip 46 of the conductive metal sheet 44 which has been punched by the punch 10 and pressed downward (pushed down) by the punch 10, whereby a punched hole (via hole)

20 is formed and the chip 46 stays (is located) in the punched hole 20. Thus, a filled via hole 24 that is a punched hole 20 filled with the chip 46 is formed. Then the upper part 12 is raised, as shown in FIG. 1(c).

By removing the conductive metal sheet 44, a resin sheet 18 having a filled via hole 24 filled with a conductor chip 46 is obtained, as shown in FIG. 1(d).

That is, through punching of the resin sheet and the conductive metal sheet superposed upon each other, a printed wiring board-forming sheet comprising a resin sheet having a through hole in the thickness direction and a conductive metal chip inserted in the through hole and having a shape substantially corresponding to the through hole is obtained.

The upper part 12 and the lower part 16 are allowed to get relatively close to each other and get away relatively from each other. That is, the lower part 16 may be driven, or both the upper part 12 and the lower part 16 may be driven.

The thickness of the conductive metal sheet 44 is almost the same as the thickness of the resin sheet 18, so that the upper end and the lower end of the filled via hole 24 formed of the chip 46 of the conductive metal sheet 44 become almost flush with the upper surface and the lower surface of the resin sheet 18.

In practice, the tip (bottom end) of the filled via hole 24 is a little rounded because of resistance applied when the resin sheet 18 is punched by the chip 46.

When the conductive metal sheet 44 is a sheet of a soft metal such as solder, the metal sheet tends to be slightly collapsed in the pressing operation. Therefore, it is preferable to use a conductive metal sheet 44 having a little larger thickness than the resin sheet 18 and to adjust so that the upper and the lower ends of the filled via hole 18 become almost flush with the upper and the lower surfaces of the resin sheet 18 after collapsed.

According to this mode, the chip 46 is forcibly located in the punched hole 20 by the punch 10 simultaneously with the formation of the punched hole 20 as described above, and hence, the chip 46 that is a conductor can be filled in the punched hole 20 more easily and more surely as compared with the conventional method for forming the filled via hole 24 through printing of a conductor paste.

In FIG. 1, a mode wherein one punch 10 is provided on the upper part 12 and one die hole 14 is provided on the lower part 16 is shown for convenience in the explanation, but actually it is possible to provide the same number of punches and die holes as that of filled via holes to be formed in the resin sheet 18. According to such constitution, filled via holes can be formed in the resin sheet 18.in a single die-pressing operation, and the period of time for forming filled via holes can be reduced.

FIG. 2 is a plan view showing an example of the produced resin sheet 18 having filled via holes 24.

By the use of a continuous resin sheet 18, a continuous conductive metal sheet 44 and a progressive die, a resin sheet 18 having filled via holes 24 of a desired pattern can be continuously prepared. Holes 19 are those for positioning and feeding.

The resin sheet 18 having filled via holes 24 produced by the above process can be used for various electrical materials.

For example, a conductive layer is formed on one surface of the resin sheet 18 and the conductive layer is etched to form a wiring pattern (not shown) electrically connected to the filled via hole 24. The resin sheet 18 having the thus formed wiring pattern can be used as, for example, a flexible printed wiring board (FPC).

If plural resin sheets 18 each of which has the wiring pattern are laminated while making electrical connection between the wiring patterns, a multi-layer wiring board can be produced (not shown).

As a matter of course, a semiconductor device 42 can be produced in a manner similar to that in the conventional process shown in FIG. 17(a). That is, conductor layers 26 are formed on both surfaces of the resin sheet 18 by plating or metal foil bonding. The conductive layers 26 are subjected to etching, and on both surfaces thereof are formed a first pad 28, a second pad 32, a first wiring pattern 30 and a second wiring pattern 34. Then, a conductor chip 36 is mounted and an external connecting terminal 40 is set, to produce a semiconductor device 42.

Figure 3:
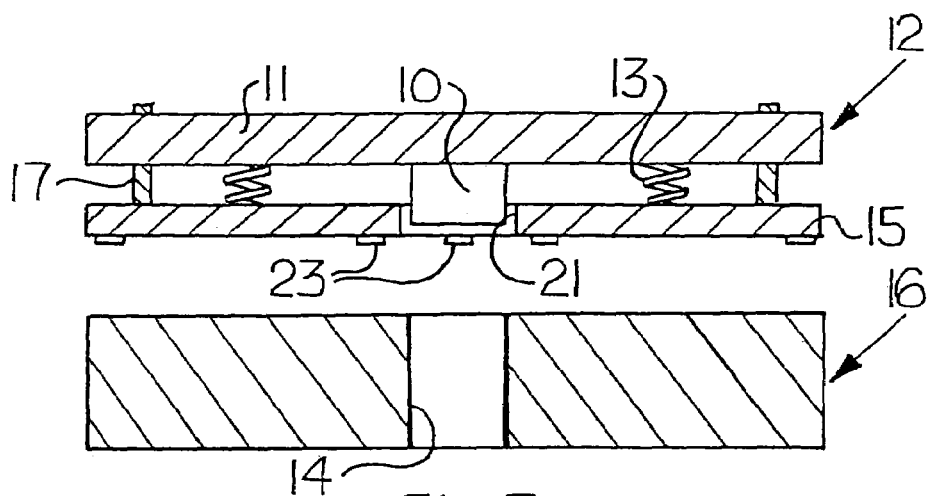
FIG. 3 is a sectional explanatory view showing an alternate embodiment of a die.

FIG. 3 is a sectional view showing an alternate example of a die used for the production.

In the die, a hold-down plate 15 is provided on the upper part 12. The hold-down plate 15 is suspended from a moving plate 11 by means of a spring 13 and is capable of getting close to or getting away from the moving plate 11 while being guided by a guide pole 17. The hold-down plate 15 is provided with a hole 21 through which the punch 10 can pass, and around the hole 21, four hold-down protrusions 23 are provided.

When the upper part 12 is lowered, the conductive metal sheet 44 is held down by the hold-down protrusions 23 prior to pressing by the punch 10. As the upper part 12 is further lowered, the metal sheet 44 is punched by the punch 10.

The metal sheet 44 is punched while the circumference of the place to be punched is held down by the hold-down protrusions 23 as described above, so that the metal sheet 44 can be prevented from extending when punched, and hence, a desired volume of the chip 46 can be ensured. That is, when the metal sheet 44 is a sheet of a soft metal such as solder, there is a possibility that the sheet may be extended to give a chip 46 of a small thickness. However, if the circumference is held down by the hold-down protrusions 23, such extension can be prevented.

Figure 4:
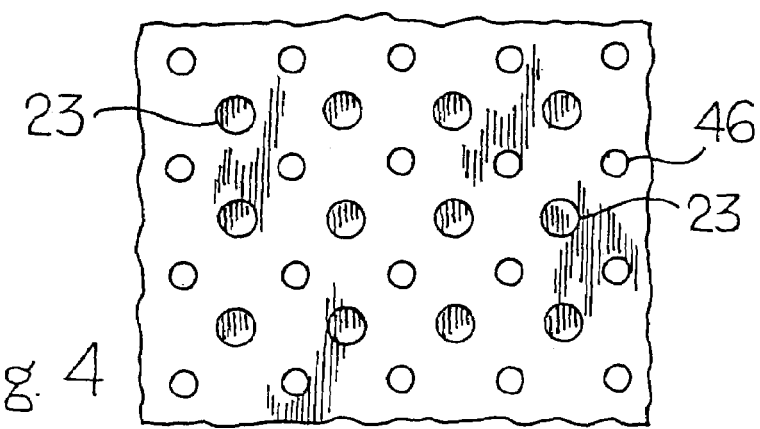
FIG. 4 is an explanatory view showing a positional relation between a hold-down protrusion of a die and a chip.

FIG. 4 schematically shows a positional relation between the hold-down protrusions 23 and the chip 46. In this figure, the circumference of the chip 46 is held down at four points by means of the hold-down protrusions 23, but the relation is not limited thereto.

The die exemplified above is a die formed by uniting a base and a punch so that they are movable relatively to each other. In the invention, however, it is not always necessary to provide the punch and the base so as to constitute a pair of upper and lower parts of a die, and it is possible to use a conductive metal chip-inserted via hole-forming device consisting of a die having a base with a die hole and a punch provided independent of the die. In this device, the punch not only forms a punched hole in the conductive metal sheet in cooperation with the die hole of the base but also pushes down a chip of the conductive metal sheet thus punched to form a through hole in the resin sheet. The punch is so controlled that the lower end of the punch stops on the surface of the resin sheet, and therefore the chip of the conductive metal sheet punched is pushed into the through hole of the resin sheet and held therein. The metal chip is conductive, and if the wiring patterns are formed on the front and back surfaces of the resin sheet, the wiring patterns formed on the front and the back surfaces of the resin sheet can be electrically connected to each other by virtue of the conductive metal chip inserted in the through hole.

Second Mode

FIG. 5 shows the second mode.

Also in this mode, the die exemplified in FIG. 1 or FIG. 3 is used, and the die is not shown in FIG. 5.

As the resin sheet 18 and the conductive metal sheet 44, those of the same materials as used in the first mode are employable. Also in the third mode and the modes thereafter, the same die, the same resin sheet 18 and the same conductive metal sheet 44 as used in the first mode are employable.

In this mode, as shown in FIG. 5(a), only the resin sheet 18 is fed to a die, and a punched hole 20 is formed in the resin sheet 18.

Subsequently, as shown in FIG. 5(b), the conductive metal sheet 44 is fed onto the resin sheet 18 having the punched hole 20, while the resin sheet 18 is allowed to stay at the same position. Then, the upper part 12 is lowered again to punch the metal sheet 44 and to push the punched metal chip 46 into the punched hole 26.

Thus, a resin sheet 18 having a filled via hole 24 can be obtained, as shown in FIG. 5(c).

As a matter of course, the resin sheet 18 can be applied to the same uses as described above.

In this mode, since the punched hole 20 is previously formed in the resin sheet 18, no excessive force is applied to the metal sheet 44 when the second pressing is performed to punch the metal sheet 44. Therefore, the punched conductor chip 46 (filled via hole 24) having been hardly extended or collapsed can be obtained and filled closely in the punched hole. This is effective especially when the metal sheet 44 is a sheet of a soft metal such as solder.

Third Mode

FIG. 6 shows the third mode.

In this mode, a resin sheet 18 having a conductive layer 26 such as a copper foil formed on one surface is used. As shown in FIG. 6(a), the resin sheet 18 and a metal sheet 44 superposed on the conductive layer 26 of the resin sheet are so fed to a die that the resin sheet 18 is on the side of the lower part (16).

The upper part 12 is lowered to punch the metal sheet 44, then the resin sheet 18 is punched by a conductive chip 46 thus punched, and the chip 46 stays in the punched hole 20. Thus, a resin sheet. 18 having a filled via hole 24 (chip 46) can be obtained, as shown in FIG. 6(b). The conductive layer 26 is thin, and therefore, if the chip 46 is a soft metal such as solder, the conductive layer 26 and the resin sheet 18 can be punched by the chip 46.

The conductive layer 26 is in contact with the filled via hole 24 and is electrically connected thereto.

By etching the conductive layer 26 to form a necessary pattern, a resin sheet 18 having a wiring pattern electrically connected to the filled via hole 24 can be produced (not shown). This resin sheet 18 can be used singly as a wiring board such as FPC, or plural resin sheets may be laminated to form a multi-layer wiring board.

Fourth Mode

FIG. 7 shows the fourth mode.

In this mode, as shown in FIG. 7(a), a resin sheet 18 having a conductive layer 26 formed on one surface is fed to a die in the same manner as in the second mode, and a punched hole 20 is formed in the resin sheet 18.

Subsequently, as shown in FIG. 7(b), a metal sheet 44 is fed onto the resin sheet 18, then the metal sheet 44 is punched by pressing, and the punched chip 46 is pushed into the punched hole 20 of the resin sheet 18.

Through the above process, a resin sheet 18 having a filled via hole 24 (conductor chip 46) similar to that in the third mode can be readily produced.

Also in this mode, the punched hole 20 is previously formed in the resin sheet 18, and the chip 46 of the metal sheet 44 punched by the second pressing is pushed into the punched hole 20. Therefore, the chip 46 can be located in the punched hole 20 without being deformed. Consequently, connection between the filled via hole 24 and the conductive layer 26 can be favorably attained.

Fifth Mode

FIG. 8 shows the fifth mode.

In this mode, a resin sheet 18 having conductive layers 26 formed on both surfaces is used.

Figure 8A:
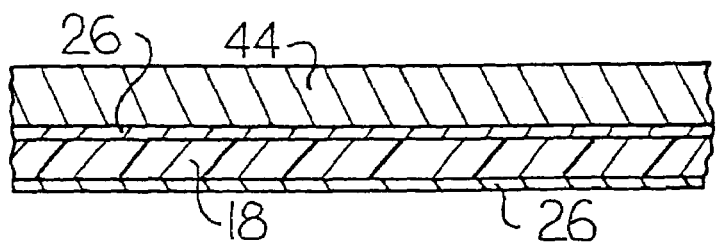
FIG. 8 is a group of explanatory views showing steps of the fifth mode.

As shown in FIG. 8(a), the resin sheet 18 and a metal sheet 44 superposed on the resin sheet are fed to a die so that the resin sheet 18 is on the side of the lower part 16.

Figure 8B:
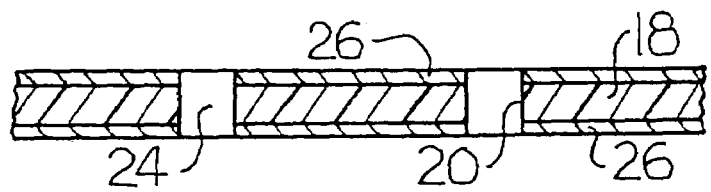

Subsequently, the metal sheet is punched by pressing in the same manner as described above. By virtue of the punched chip 46, the conductive layers 26 and the resin sheet 18 are punched, and the conductor chip 46 stays in the punched hole 20. Thus, a resin sheet 18 having a filled via hole 24 (chip 46) can be obtained, as shown in FIG. 8(b).

The filled via hole 24 is in contact with both of the conductive layers 26.

By etching both of the conductive layers 26 to form necessary wiring patterns, the resin sheet can be used as a wiring board or a semiconductor device.

Figure 8C:
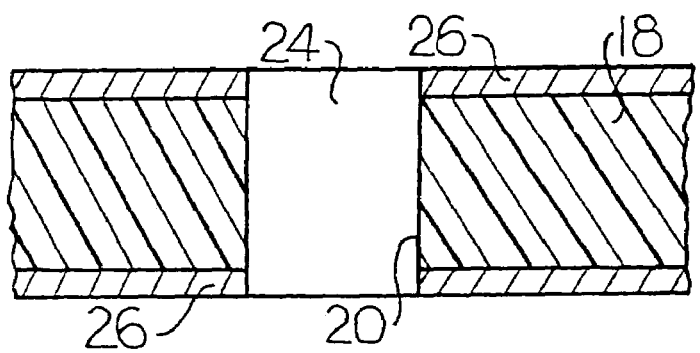
Figure 8D:
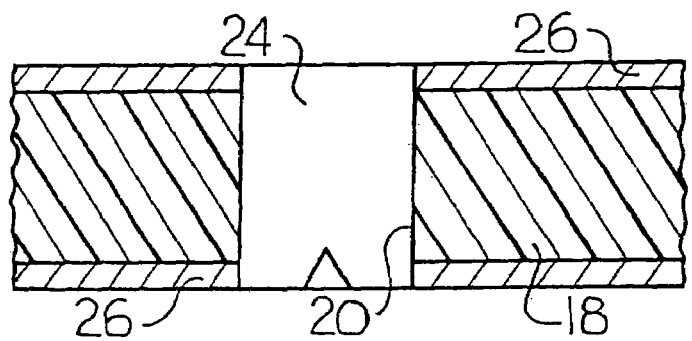

In the above process, however, the tip (lower end) of the filled via hole 24 (conductor chip) may be a little rounded, and there is a fear of incomplete connection between the filled via hole and the conductive layer 26 shown in FIG. 8(c). In this case, it is preferable to wedge a wedge punch (not shown) into the round head as shown in FIG. 8(d) to externally spread the head and thereby ensure connection between the filled via hole and the conductive layer 26.

Sixth Mode

FIG. 9 shows the sixth mode.

Also in this mode, a resin sheet 18 having conductive layers 26 formed on both surfaces is used.

Figure 9A:
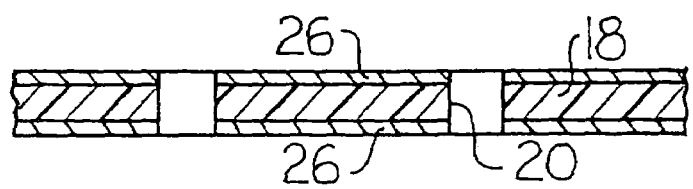
FIG. 9 is a group of explanatory views showing steps of the sixth mode.

First, the resin sheet 18 is fed to a die, and a punched hole 20 is formed in the resin sheet 18, as shown in FIG. 9(a).

Figure 9B:
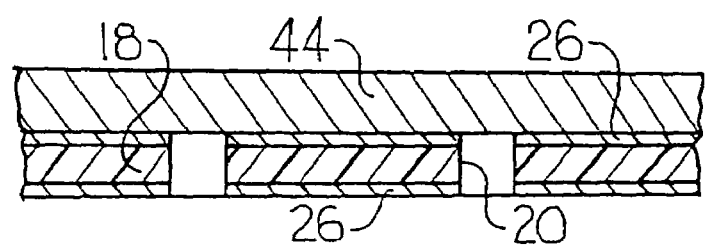

Subsequently, as shown in FIG. 9(b), a metal sheet 44 is fed onto the resin sheet 18, then the metal sheet 44 is punched by pressing, and the punched chip 46 is pushed into the punched hole 20 of the resin sheet 18.

Through the above process, a resin sheet 18 having a filled via hole 24 (conductor chip 46) similar to that in the fifth mode shown in FIG. 8(b) can be readily produced.

Also in this mode, the punched hole 20 is previously formed in the resin sheet 18, and the conductor chip 46 of the metal sheet 44 punched by the second pressing is pushed into the punched hole 20. Therefore, the conductor chip 46 can be located in the punched hole 20 without being deformed. Consequently, connection between the filled via hole 24 and the conductive layer 26 can be favorably attained.

Seventh Mode

FIG. 10 shows the seventh mode.

A feature of this mode is that the thickness D2 of the conductive metal sheet placed on the base 16 is larger than the thickness $D_1$ of the resin sheet.

On the base 16, the resin sheet 18 and the conductive metal sheet 44 superposed on the resin sheet are placed, and the upper part 12 is lowered to punch the conductive metal sheet 44 by means of the punch 10.

The upper part is so controlled that the lower end of the punch 10 descends until it almost coincides with the lower surface of the conductive metal sheet 44 but descends no more.

The resin sheet 18 is pressed by the conductor chip 46 punched from the metal sheet 44 and then punched by the conductor chip.

Figure 10A:
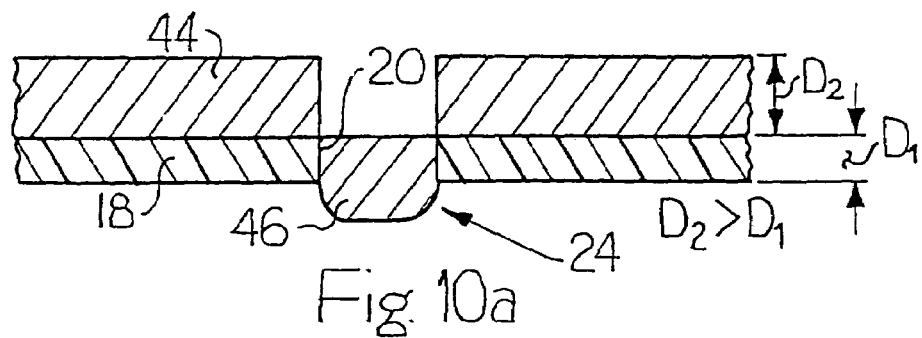
FIG. 10 is a group of explanatory views showing steps of the seventh mode.

In this mode, the thickness of the metal sheet 44 is sufficiently larger than that of the resin sheet 18, and hence, the conductor chip 46 punched from the metal sheet 44 is located in the punched hole 20 of the resin sheet 18 so that the lower end of the chip 46 protrudes from the punched hole 20 (protrudes from the lower surface of the resin sheet 18), as shown in FIG. 10(a).

Consequently, a resin sheet 18 having a filled via hole 24 that is composed of the chip 46, the lower end of which protrudes from the lower surface of the resin sheet 18 and the upper end of which is almost flush with the upper surface of the resin sheet, can be produced.

Figure 11:
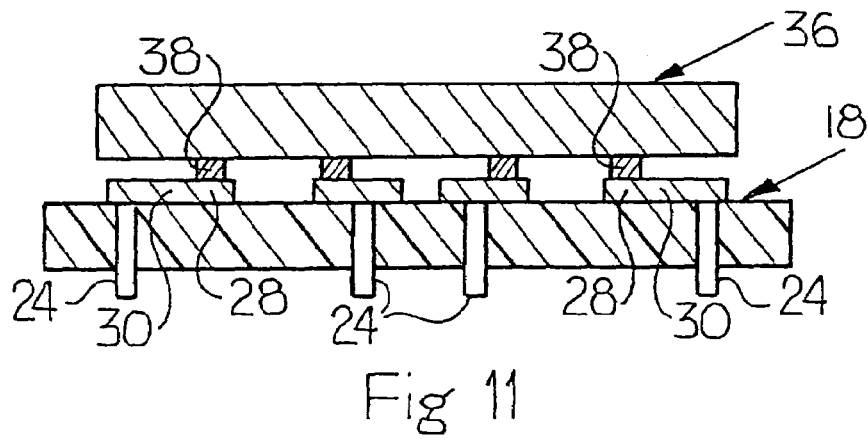
FIG. 11 is an explanatory view of a semiconductor device using a protrusion of a filled via hole as an external connecting terminal.

Production of a semiconductor device using the resin sheet 18 with a filled via hole 24 obtained by the above process is described below with reference to FIG. 11.

If the position where the punched hole 20 is formed is allowed to coincide with the position where an external connecting terminal 40 is formed, the lower end of the conductive metal sheet chip 46 protruding from the punched hole 20 of the resin sheet 18 can be used as the external connecting terminal.

If a wiring pattern 30 including a pad 28, which is connected to the upper end of the filled via hole 24, is formed on the upper surface of the resin sheet 18 and if a semiconductor chip 36 is mounted on the pad 28, the resulting sheet can be used as a semiconductor device.

Since it is unnecessary to form a wiring pattern or a bump on the lower surface of the resin sheet 18, the steps for the production can be simplified.

The lower end of the conductor chip 46 of the conductive metal sheet protrudes from the punched hole 20 of the resin sheet 18. In the formation of the punched hole 20 in the resin sheet 18, this lower end is made to have a curved surface where its center projects farther than the circumferential area. On this account, when the conductor chip is used as the external connecting terminal as in this mode and mounted on a mounting substrate by soldering, there are merits that self alignment by soldering is readily made and mounting at the accurate position is feasible.

As described above, the resin sheet 18 having a filled via hole 24 obtained in this mode can be used as an outermost mounting substrate of a wiring board.

Eighth Mode

FIG. 12 shows the eighth mode.

Figure 12A:
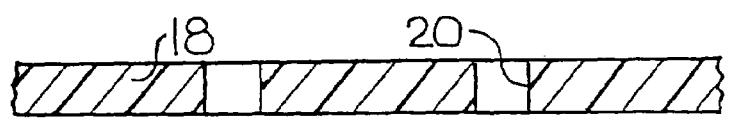
FIG. 12 is a group of explanatory views showing steps of the eighth mode.

In this mode, as shown in FIG. 12(a), a resin sheet 18 is fed to a die, and a punched hole 20 is formed in the resin sheet 18 in the same manner as in the seventh mode.

Figure 12B:
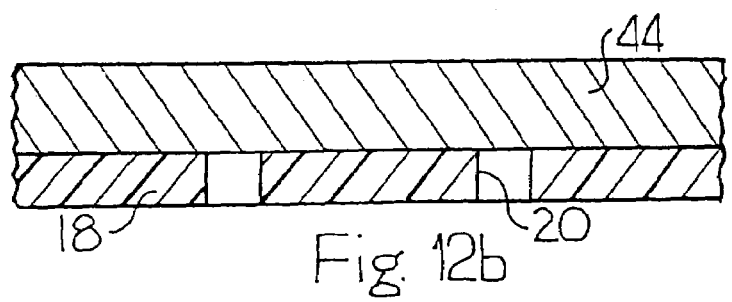
Figure 15:
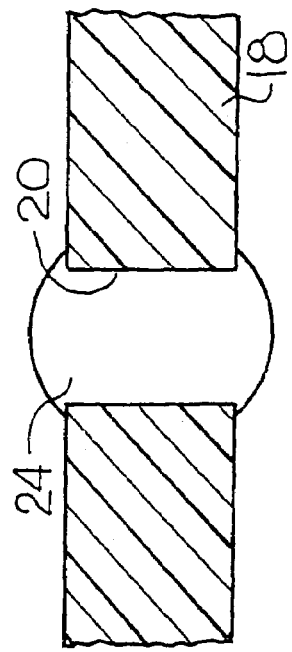
FIG. 15 is an explanatory view showing a collapsed head of a filled via hole.

Subsequently, as shown in FIG. 12(b), a metal sheet 44 having a larger thickness than the resin sheet 18 is fed onto the resin sheet 18, then the metal sheet is punched by pressing, and the conductor chip 46 thus punched is pushed into the punched hole 20 of the resin sheet 18.

Figure 10B:
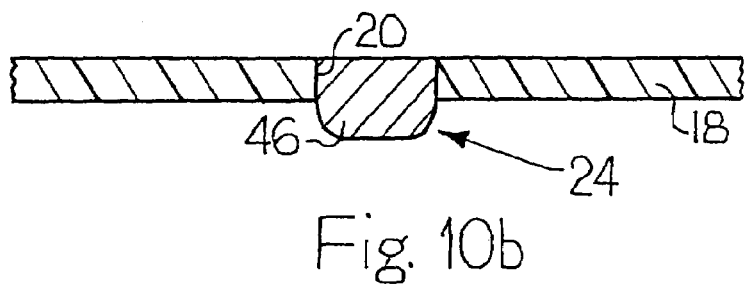

Also in this case, a resin sheet 18 having a filled via hole 24 the tip of which protrudes downward from the punched hole 20 can be produced similarly to the mode shown in FIG. 10(b).

In this mode, the punched hole 20 is previously formed in the resin sheet 18, and hence the filled via hole 24 (conductor chip 46) can be readily and surely located in the punched hole 20.

Ninth Mode

FIG. 13 shows the ninth mode.

In this mode, a resin sheet 18 having a conductive layer 26 such as a copper foil formed on one surface is used.

Figure 13A:
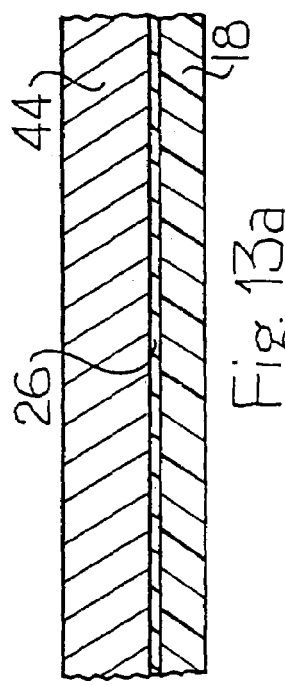
FIG. 13 is a group of explanatory views showing steps of the ninth mode.

As shown in FIG. 13(a), the resin sheet 18 and a metal sheet 44 which has a larger thickness than the resin sheet 18 and is superposed on the conductive layer 26 of the resin sheet 18 are so fed to a die that the resin sheet is on the side of the lower part 16.

Figure 13B:
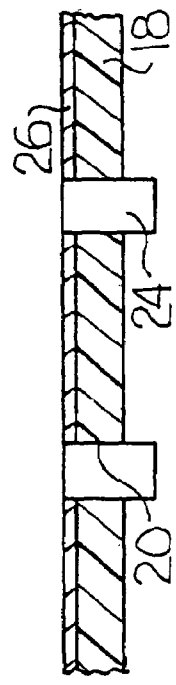

The upper part 12 is lowered to punch the metal sheet 44, then the conductive layer 26 and the resin sheet 18 are punched by the punched conductor chip 46, and the chip 46 stays in the punched hole 20. Thus, a resin sheet 18 having a filled via hole 24 (conductor chip 46) can be obtained, as shown in FIG. 13(b). The conductive layer 26 is thin, and therefore, if the conductor chip 46 is a soft metal such as solder, the conductive layer 26 and the resin sheet 18 can be punched by the conductor chip.

The conductive layer 26 is in contact with the filled via hole 24 and electrically connected thereto.

The tip (lower end) of the filled via hole 24 protrudes downward from the sheet.

By etching the conductive layer to form a necessary pattern, a resin sheet 18 having a wiring pattern electrically connected to the filled via hole 24 can be produced (not shown).

Also the resin sheet 18 can be used as an outermost mounting substrate of a wiring board.

Tenth Mode

FIG. 14 shows the tenth mode.

Figure 14A:
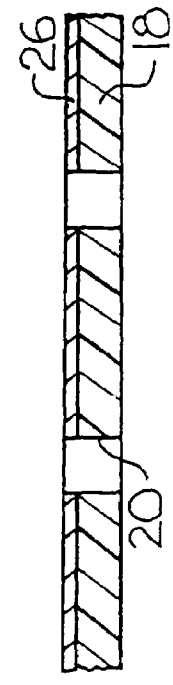
FIG. 14 is a group of explanatory views showing steps of the tenth mode.

In this mode, as shown in FIG. 14(a), a resin sheet 18 having a conductive layer 26 formed on one surface is fed to a die, and a punched hole 20 is formed in the resin sheet 18.

Figure 14B:
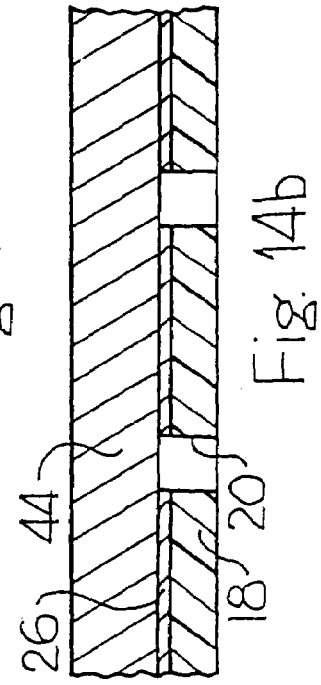

Subsequently, as shown in FIG. 14(b), a metal sheet 44 having a larger thickness than the resin sheet 18 is fed onto the resin sheet 18, then the metal sheet is punched by pressing, and the punched chip 46 is pushed into the punched hole 20 of the resin sheet 18.

Through the above process, a resin sheet 18 having a filled via hole 24 (conductor chip 46) the tip of which protrudes downward from the resin sheet can be readily produced similarly to the mode shown in FIG. 13(b).

Also in this mode, the punched hole 20 is previously formed in the resin sheet 18, and the conductor chip 46 of the metal sheet 44 punched by the second pressing is pushed into the punched hole 20. Therefore, the conductor chip 46 can be located in the punched hole 20 without being deformed. Consequently, connection between the filled via hole 24 and the conductive layer 26 can be favorably attained.

In the resulting resin sheets shown in FIGS. 10, 12 and 13, it is preferable that both ends of the filled via hole 24 are collapsed and externally spread like an umbrella to prevent the conductor chip from falling out of the punched hole 20 or to further ensure connection to the conductive layer.

Various preferred modes of the present invention are described above, and the resin sheet produced by the invention may be used as a resin sheet having a heat transfer filled via hole such as a thermal via hole.

In the present invention, a resin sheet and a conductive metal sheet are placed in this order on a base having a die hole, and they are punched together by means of a punch to insert a conductor chip of the conductive metal sheet thus punched into a through hole that is formed in the resin sheet through the punching. In this process, therefore, the resin sheet can be punched by pushing down the chip of the conductive metal sheet punched, so that the lower end of the punch has only to be stopped on the surface of the resin sheet after the punch penetrates the conductive metal sheet. When the through hole is previously formed in the resin sheet, the conductive metal sheet in contact with the punch is pressed by the punch, whereby the conductor chip punched from the conductive metal sheet is inserted into the through hole previously formed in the resin sheet. Accordingly, collapse of the chip hardly takes place. It is advantageous to use the above device also for the previous formation of the through hole in the resin sheet. Therefore, the above device preferably has a stop-position control means to so control the punch stop position that the punch stops on the surface of the resin sheet (first stop position) and a stop-position control means to so control the punch stop position that the punch stops at the position (second stop position) for punching the resin sheet and thereby forming a through hole.

If the conductive metal chip protrudes from the surface of the resin sheet in the printed wiring board-forming sheet produced by the process of the invention and if such a printed wiring board-forming sheet having conductive metal chip protrusion is press-bonded to another printed wiring board-forming sheet through an insulating layer, the conductive metal chip protrusion penetrates the insulating layer to electrically connect those printed wiring board-forming sheets. That is, by the use of the printed wiring board-forming sheets of the invention, a multi-layer printed wiring board can be readily produced.

The printed wiring board of the invention is, for example, a double-sided metal TAB tape having wiring pattern formed on one or both surfaces of an insulating substrate, single-sided or double-sided CSP, or single-sided or double-sided BGA. In the printed wiring board of the invention, the insulating substrate has a through hole, and a conductor is inserted in the through hole, so that the front and back surfaces of the insulating substrate can be electrically connected to each other. Therefore, the printed wiring board is suitable as a printed wiring board having wiring layers on its both surfaces. Such a printed wiring board of the invention has an insulating substrate and a wiring layer formed on at least one surface of the substrate (or wiring layers formed on both surfaces of the substrate, if desired). As the insulating substrate, a polyimide film is generally used. The wiring layer can be formed by, for example, the following method. A conductive metal such as a copper foil is laminated on the surface of the insulating substrate, then a photoresist is applied, and the photoresist is exposed and developed to form a given pattern. Using the photoresist as a masking material, the conductive metal is etched to form a wiring pattern.

The insulating substrate having a wiring layer formed as above preferably has a through hole formed by the aforesaid method. In the printed wiring board of the invention, the through hole formed by the aforesaid method is filled with a conductor. Filling of the through hole with the conductor can be carried out using a method which uses the punch and the die having a base with a die hole and which comprises placing an insulating substrate on a base, further placing a conductor sheet on the surface of the insulating substrate, punching the conductor sheet, further punching the insulating substrate by means of the conductor chip thus punched, and pushing the conductor chip used for punching into the through hole formed by punching. It is also possible to previously form the through hole in the insulating substrate and then fill the through hole with the conductor chip punched from the conductor sheet in a manner similar to the above.

As the conductor used herein, a foil or a sheet of lead, tin, copper, a copper alloy or an alloy containing any of these metals as a main component is suitable.

Next, the process for producing a printed wiring board according to the invention is described. The present invention is applicable to a wide range of tapes using flexible polyimide or the like such as a TAB tape, CSP, BGA and FPC and so-called multi-layer boards using rigid substrate such as glass epoxy. Now, a process for producing a TAB tape, particularly a so-called double-sided metal TAB tape having wiring layers formed on both surfaces, is described.

Figure 16:
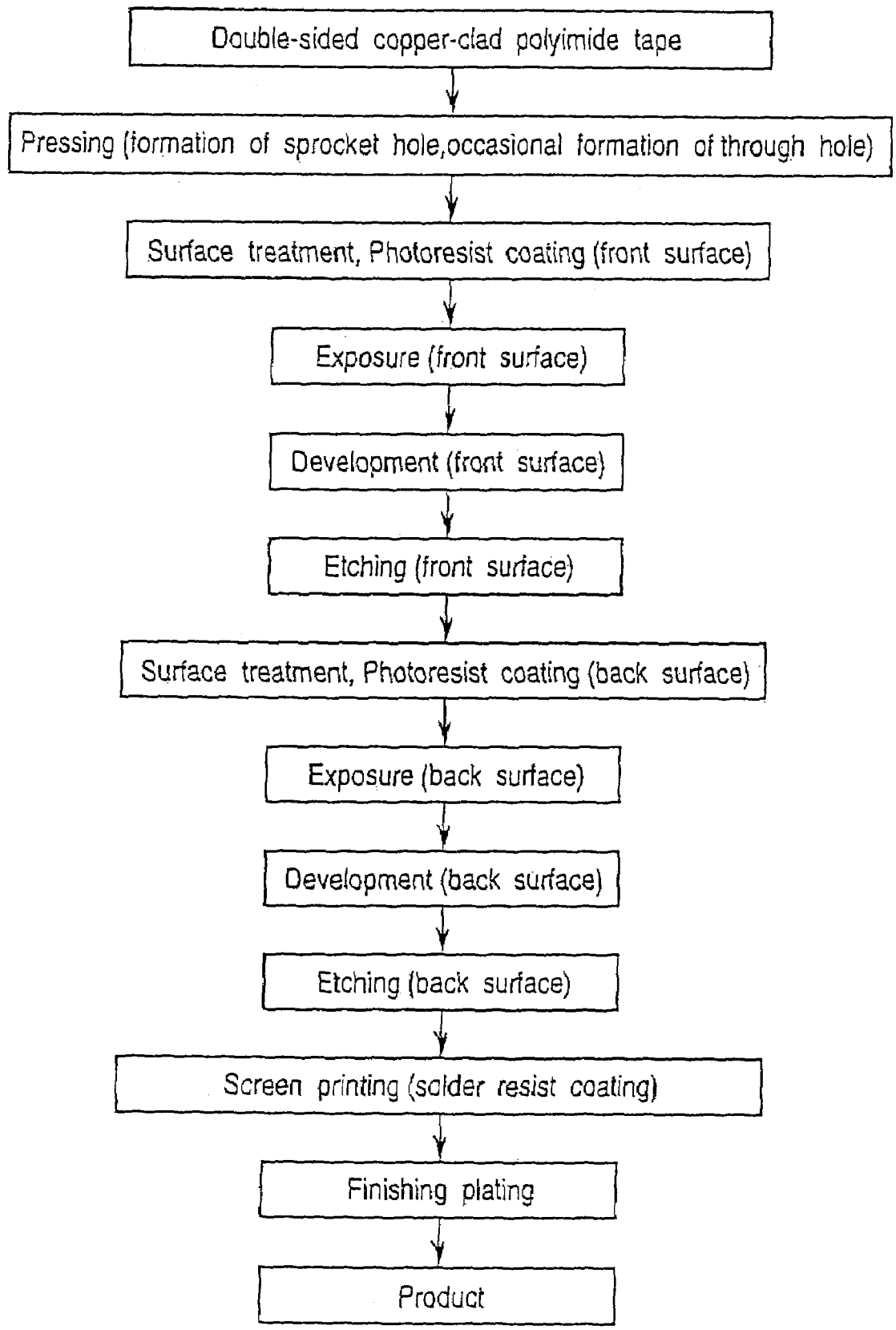
FIG. 16 is a chart showing the steps of a conventional process for producing a double-sided metal TAB tape.

FIG. 16 is a view showing steps of an ordinary process for producing a double-sided metal TAB tape. As shown in FIG. 16, a sprocket hole is formed in a double-sided copper-clad polyimide tape by means of a press. If a through hole is previously formed, formation of the through hole may be carried out simultaneously with the formation of the sprocket hole.

Thereafter, the front surface of the insulating substrate is treated and coated with a photoresist. In order to form a desired pattern, the photoresist is exposed and developed, and the metal foil is etched using the developed photoresist as a masking material. Thus, a wiring layer (wiring pattern) can be formed on the front surface of the insulating substrate.

Then, similarly to the above, the back surface of the insulating substrate is treated and coated with a photoresist, the photoresist is exposed and developed, and the metal foil is etched using the developed photoresist as a masking material, whereby a wiring layer (wiring pattern) can be formed on the back surface of the insulating substrate.

Subsequently, a solder resist is applied by screen printing, and then finish plating such as gold plating is performed to improve connection reliability.

According to the invention, in addition to the above steps, a through hole is formed by a punching press, and then the through hole is filled with a conductor by a punching press to electrically connect the conductor to the wiring layer or the metal foil.

In the above process, formation of the through hole by a punching press and filling of the through hole with the conductor may be carried out in any stage. For example, after formation of the wiring layers on both of the front and back surfaces, the through hole may be formed and filled with the conductor, or the through hole may be first formed in the double-sided copper-clad tape simultaneously with formation of a sprocket hole and then filled with the conductor.

In the present invention, it is preferable to form the through hole by the use of a punch and a die having a base with a die hole as previously described in detail. In this process, the formation of the through hole is made by a punching operation which requires no desmearing, and besides electrical connection is also made by the use of a usual punching press machine similarly to the above punching operation. That is, this is an extremely simple process wherein a conductor such as a solder plate or a copper foil is superposed on the substrate having a hole formed by punching and then punched again to insert the conductor in the hole, and this leads to cost reduction.

In the above process, determination of a thickness of the substrate and a thickness of the conductor (plate) to be embedded (to be filled), selection of a material (hardness) of the conductor (plate), a punching stroke and a post treatment such as pressing, and setting of the conditions are made.

For example, there are optimum ranges of the thickness (t1) of the conductor and the thickness (t2) of the substrate. Those thicknesses are determined so as to satisfy a relation of preferably $1.4 \times t2 \geq t1 \geq 0.7 \times t2$, more preferably $1.3 \times t2 \geq t1 \geq 0.8 \times t2$, still more preferably $1.2 \times t2 \geq t1 \geq 0.9 \times t2$. When the thicknesses are determined as above, unevenness of the substrate surface hardly occurs, and electrical connection between the front and back surfaces of the insulating substrate is easily attained.

As the material of the conductor, solder or a copper foil is suitable as described above, and it is preferable to select a metal having such an appropriate hardness to minimize surface unevenness. If the hardness of the conductor is too high, the substrate itself tends to have an uneven surface. The solder is soft and employable as it is. On the other hand, the copper foil is made soft by annealing or the like, and as a result, a chip of the copper foil can be favorably inserted into the through hole. Although the metal to be inserted into the through hole has only to be a metal capable of making electrical connection, the solder is advantageous from the viewpoint of cost because it can be easily recycled.

It is preferable to determine a punching stroke so that the conductor can penetrate the substrate like a skewer by the punching operation and that the subsequent pressing operation can be favorably carried out.

The pressing operation after filling (embedding) of the conductor has an influence on the connection reliability. After the conductor is embedded, the resulting tape substrate is often wound around a reel in order to smoothly perform a carrying operation or another operation in the subsequent stage, and the above-mentioned pressing operation also imparts resistance to bending to the tape substrate.

Figure 17:
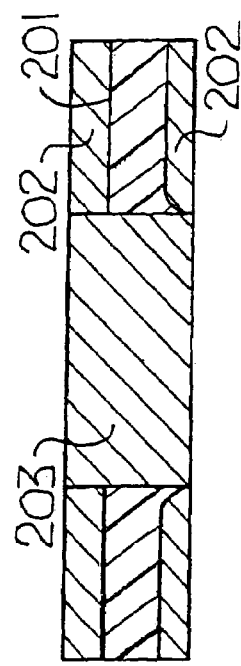
FIG. 17 is a schematic sectional view of a through hole of a printed wiring board according to the invention.

FIG. 17 is a schematic sectional view of a through hole of the printed wiring board of the invention obtained as above. Referring to this figure, numerals 201, 202 and 203 designate an insulating substrate, a wiring layer and a conductor, respectively. As shown in FIG. 17, favorable electrical connection is made between the wiring layers 202 on the front and back surfaces and the conductor.

Figure 18:
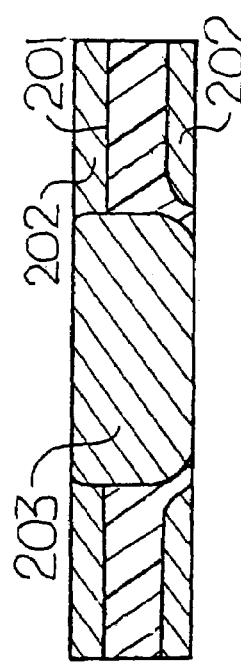
FIG. 18 is a schematic sectional view similar to that of FIG. 17 showing a through hole of a printed wiring board.

If the formation of the through hole and the embedding of the conductor in the through hole could be made at the same time, the process might be further simplified, and this leads to cost reduction. As shown in FIG. 18, however, the lower end of the conductor 203 tends to be rounded, and even if the pressing operation is made thereafter, the connection reliability sometimes becomes poor. When a metal having a low melting point such as solder, the contact can be made sure by melting the filled metal again through reflowing or the like.

As described above, the present invention is applicable to a wide range of tapes using flexible polyimide or the like such as a TAB tape, CSP, BGA and FPC and so-called multi-layer boards using rigid substrate such as glass epoxy.

That is, in the present invention, a through hole is formed by punching or the like at the position of an insulating sheet where a conductive material (conductor) corresponding to the conventional conductive bump is to be provided, the through hole is filled with the conductor (conductive material), and at least one end of the conductor (conductive material) in the through hole is allowed to protrude from the surface of the wiring pattern or the insulating sheet, whereby a printed wiring board (unit board) can be formed, without using such a conductive bump printing method as in the conventional build-up process.

In the unit board, electrical connection can be made in the thickness direction by means of the conductor protruding from the unit board. Therefore, by the use of a large number of unit boards, a multi-layer printed wiring board wherein a large number of unit boards are laminated and electrically connected to one another can be produced.

At present, fine wiring patterns have been developed, and hence formation of a through hole by punching or the like can be carried out more easily and more accurately than formation of a conductive bump by printing.

When plural unit boards having such protrusions as mentioned above are laminated through insulating adhesive layers and press-bonded together, the protrusions penetrate the insulating adhesive layers to make electrical connection between the wiring patterns or the conductive materials of the neighboring unit boards. Accordingly, in a mere single operation of press-bonding of the unit boards, the unit boards are electrically connected to one another independent of the number of the unit boards, whereby a multi-layer printed wiring board can be easily produced.

The conductor chip filled in the through hole in the unit board has not only a function of electrically connecting the wiring patterns of the neighboring unit boards but also a function of electrically connecting the upper and lower wiring patterns of the unit board containing this conductor chip. As the conductor chip (conductive material), lead, tin, copper, nickel, a copper alloy or an alloy containing any of these metals as a main component such as solder is suitable. In addition, indium or a precious metal such as gold or silver is employable.

For the unit board used in the invention, materials used for substrates of usual printed wiring boards are employable without any restriction. For example, a polyimide resin is preferably used. There is no specific limitation on the material of the wiring pattern or the forming method. For example, formation of a copper layer, masking of the layer by application of a photoresist, exposure and development of the photoresist, and etching are subsequently conducted to form a desired wiring pattern. A wiring pattern may be formed also on the other surface of the unit board, when needed, whereby a unit board having wiring patterns on both surfaces can be obtained.

The number of through holes to be formed depends upon the number of wiring patterns requiring electrical connection or the positional relation between the wiring patterns. The diameter of the through hole is desired to be as small as possible with the proviso that sufficient electrical connection is ensured.

As for the formation of a through hole in the unit board and the filling of the through hole with a conductor chip (conductive material), it is preferable to fill the through hole with the conductor chip (conductive material) after the through hole is formed using a die. However, it is possible that the unit board and a conductive metal sheet (made of the same material as the conductive material) placed between the unit board and a die are subjected to punching pressing to not only form a through hole but also fill the through hole with the conductor chip. If the formation of the through hole and the filling of the through hole with the conductor chip (conductive material chip) are performed in a single operation, the tip of a protrusion formed tends to be rounded, and as a result the connection reliability may become poor. Therefore, it is preferable to form a through hole first and then fill the through hole with the conductor chip.

The punching operation that is preferably used for forming the through hole and filling the conductor chip is carried out in a conventional manner. Although the punching operation itself is simple, it is preferable to determine the thickness (t1) of the conductive material excluding the thickness of the protrusion and the thickness (t2) of the insulating sheet of the unit board in consideration of a post treatment such as pressing and the conditions. The thickness t1 and the thickness t2 preferably have the following relation.

That it, the thickness (t1) of the conductor sheet and the thickness (t2) of the insulating sheet have a relation of preferably $1.4 \times t2 \leq t1 \leq 0.7 \times t2$, more preferably $1.2 \times t2 \leq t1 \leq 0.9 \times t2$. If the thickness of the conductor sheet and the thickness of the insulating sheet are determined as above, unevenness hardly occurs. In addition, sufficient electrical connection can be ensured.

By performing pressing after insertion of the conductor into the through hole as described above, favorable electrical connection between the front and back surfaces of the insulating substrate can be obtained. That is, not only the connection reliability is improved but also the conductor chip can be surely fixed in the through hole. Hence, the conductor chip can be prevented from positional deviation or falling.

The length of the protrusion formed on at least one of the upper and lower sides of the conductor chip (conductive material) depends upon the thickness of the insulating adhesive layer used, and it is usually in the range of 10 to 500 µm. The protrusion may be provided on the upper or the lower side of the conductive material according to the necessary electrical connection. When plural conductor chips are inserted, a part of them may have no protrusion.

For the insulating adhesive layer, a thermosetting resin not completely set, i.e., so-called prepreg, is desirably used. A hot melt type resin, i.e., a thermoplastic resin, is also employable.

The conductor chip in the through hole is not always sufficiently connected to the wiring pattern, so that a plating layer extending from the conductor to the wiring pattern may be formed, or one or both of the conductor and the wiring pattern may be subjected to reflowing to change their interface into an alloy, whereby the electrical connection is further ensured.

The multi-layer printed wiring board produced by the invention is applicable to a TAB tape, CSP, BGA, FPC and various printed wiring boards using rigid substrate such as glass epoxy.

Next, a mode of a process for producing a printed wiring board according to the invention is described with reference to the attached drawings.

FIGS. 23(a) to 23(e) are vertical sectional views showing a series of steps for producing a single printed wiring board (unit board).

Figure 23A:
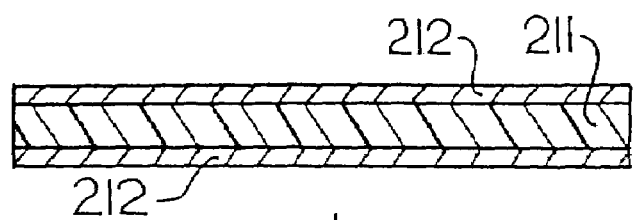
FIGS. 23(a) to 23(e) are vertical sectional views showing a series of steps for producing a printed wiring board of the present invention.

A laminate (CCL, copper-clad laminate) of two-layer type consisting of an insulating sheet 211 made of polyamide or the like and copper layers 211 formed on both surfaces of the insulating sheet is used (FIG. 23(a)). Instead of the two-layer type laminate, a three-layer type laminate in which an adhesive layer is interposed between the insulating sheet 211 and the copper layer 212 may be used. In the use of the laminate having an adhesive layer, however, the adhesive sometimes sticks to the punch to reduce the operational efficiency.

Figure 23B:
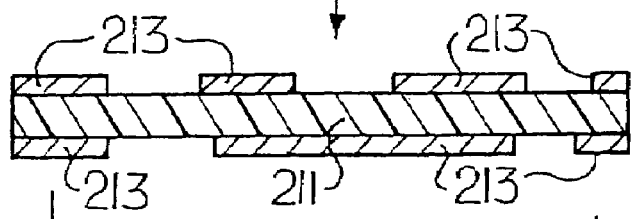

The copper layer 212 is subjected to masking and then subjected to etching using an appropriate reagent to form a wiring pattern 213 on the surface of the insulating substrate (FIG. 23(b)). Then, a through hole is formed by any of the following different two methods (FIG. 23(c) and FIG. 23(d)), and the through hole is filled with a conductor.

Figure 23C:
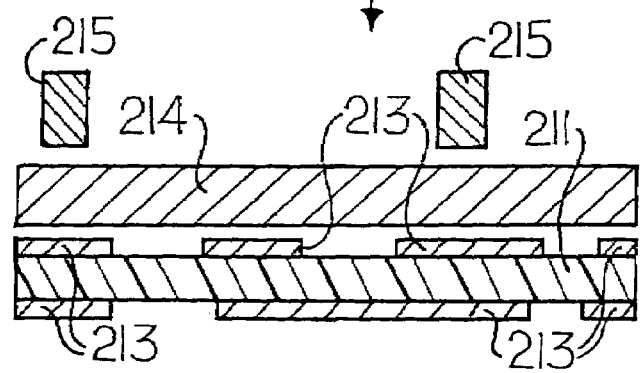

In the method shown in FIG. 23(c), above and apart from the insulating sheet 211 having the wiring pattern 213, a conductive metal sheet 214 made of the same metal as that of the conductor is located, and above the conductive metal sheet, a punching die 215 having the same diameter as that of a through hole to be formed is located. The conductive metal sheet 214, the wiring pattern 213 and the insulating sheet 211 are punched with the die 215 by the use of a pressing machine to open a through hole 216 in the wiring pattern 213 and the insulating sheet 211 and to advance the conductive metal sheet 214 into the through hole 216, whereby the through hole 216 is filled with a conductive material 217 that is a part of the conductive metal sheet, and a tip of the conductive material 217 protrudes from the lower wiring pattern 213 to form a protrusion 218. Thus, a unit board 219 is produced (FIG. 23(e)).

Figure 23D:
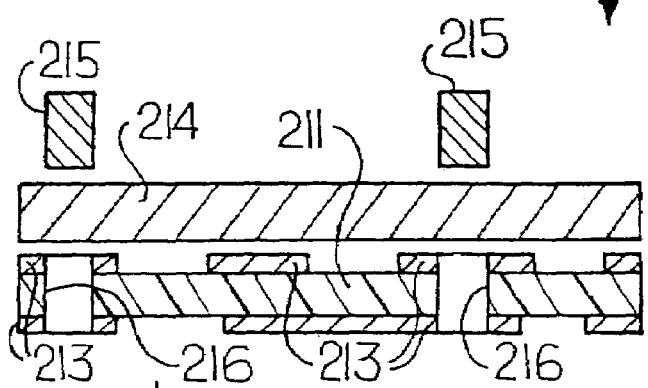

In the method shown in FIG. 23(d), a through hole 216 is opened in the insulating sheet 211 having the wiring pattern 213 of FIG. 23(b) by the use the same die as shown in FIG. 23(c), then a conductive metal sheet 214 is located above the insulating sheet 211, and the die 215 having been used for forming the through hole 216 is located. Then, the conductive metal sheet 214 is punched with the die 215 by the use of a pressing machine, whereby the through hole 216 is filled with a part of the conductive metal sheet 214, and a tip of the conductive material 217 protrudes from the lower wiring pattern 213 to form a protrusion 218. Thus, a unit board 219 is produced (FIG. 23(e)).

Figure 23E:
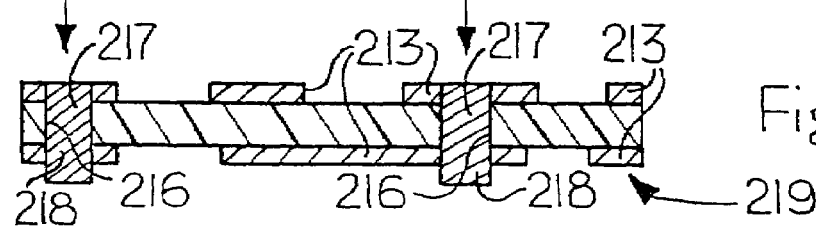
Figure 24A:
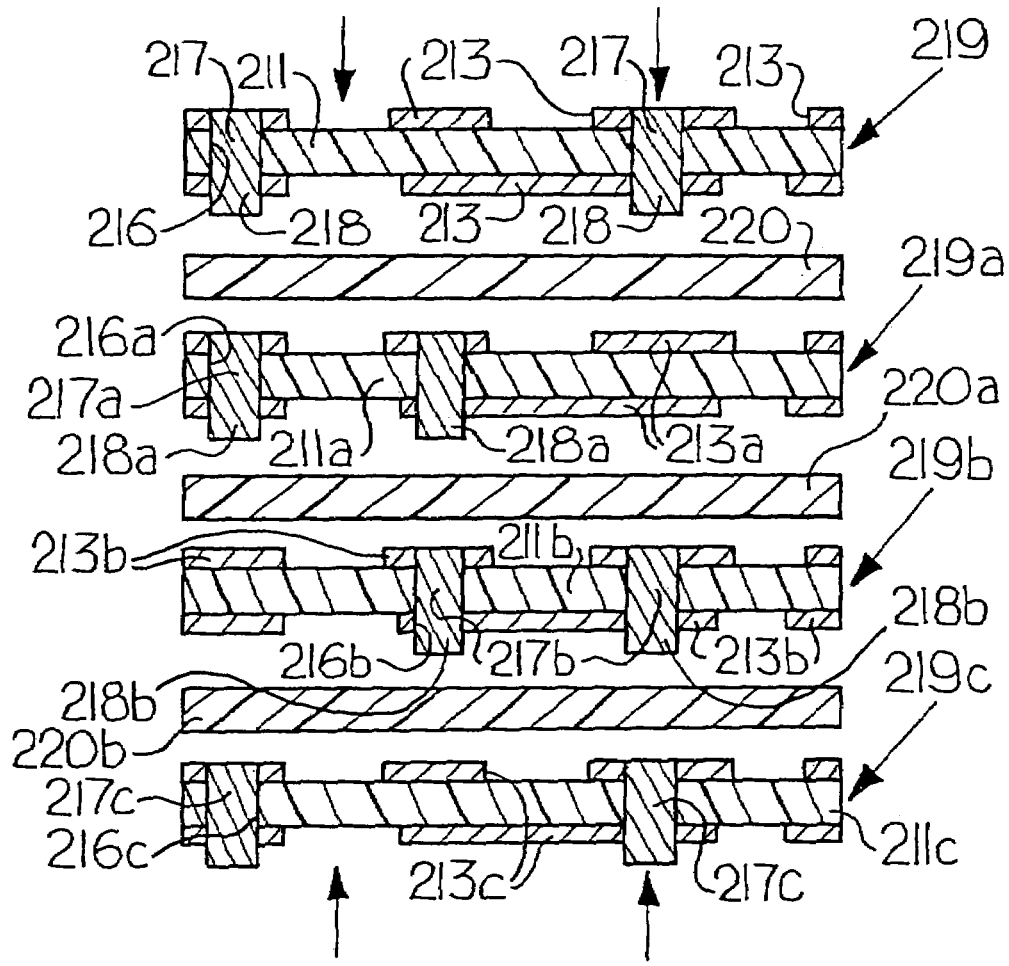
FIG. 24(a) and FIG. 24(b) show a state before the laminating operation and a state after the laminating operation, respectively.
Figure 24B:
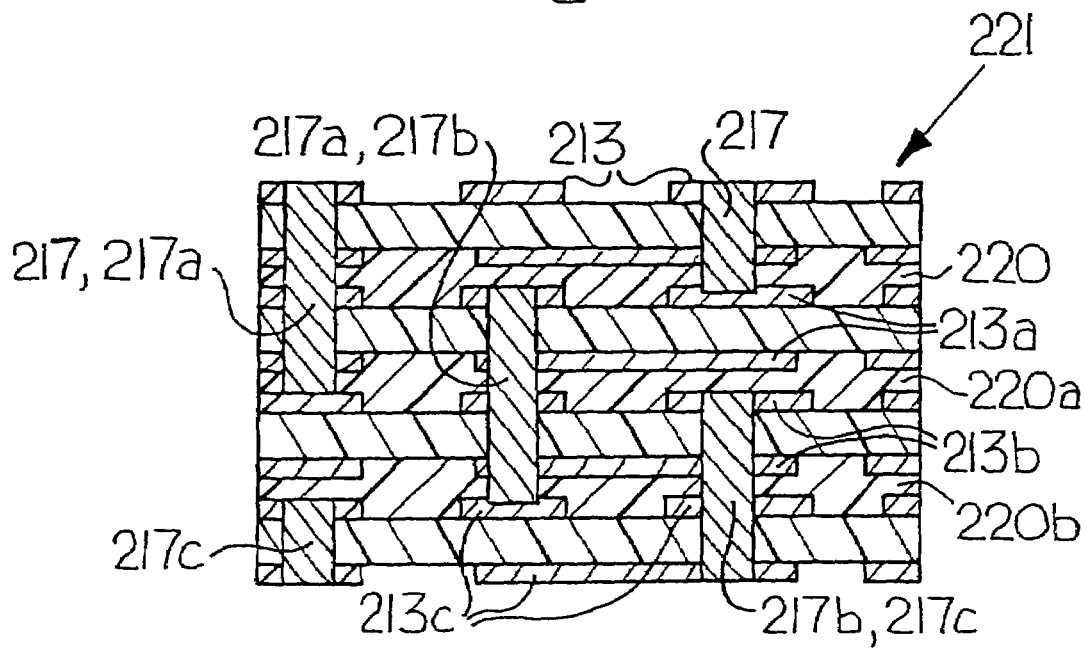
Figure 26A:
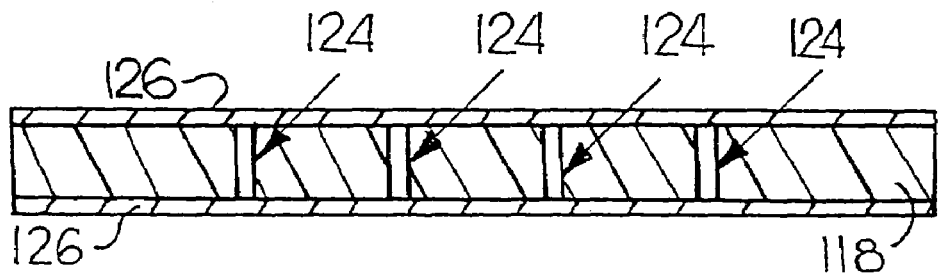
FIG. 26 is a group of explanatory views showing constitution of a semiconductor device.
Figure 26B:
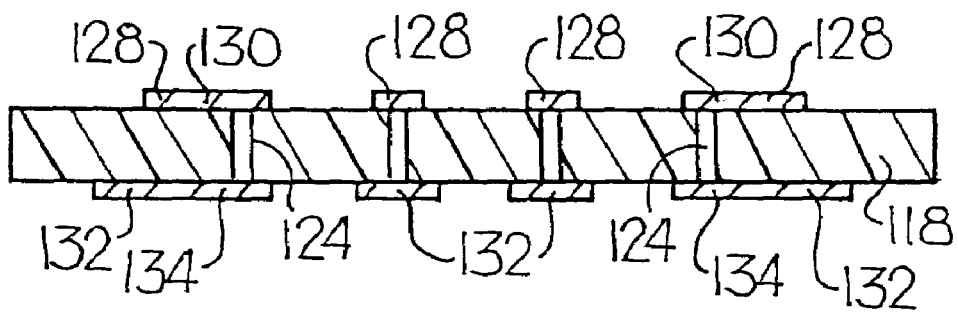
Figure 26C:
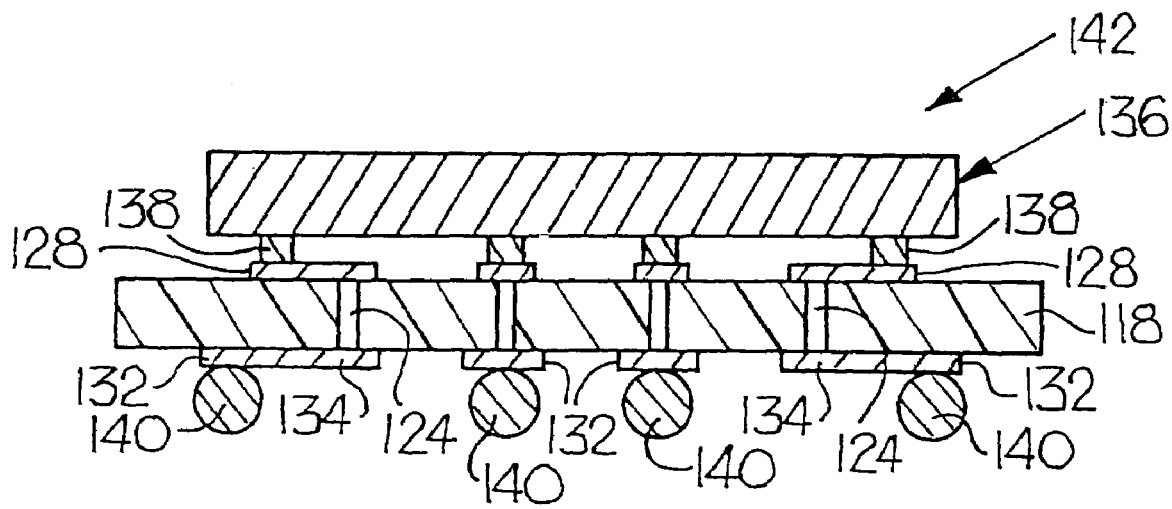
Figure 27A:
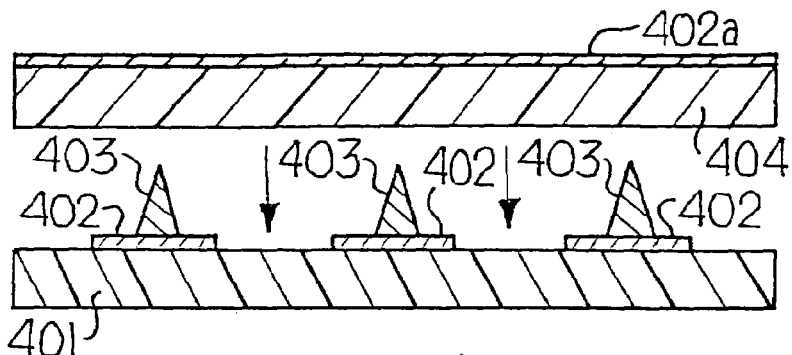
FIG. 27 is a group of vertical sectional views showing a series of steps for producing a multi-layer printed wiring board through a conventional build-up process.
Figure 27B:
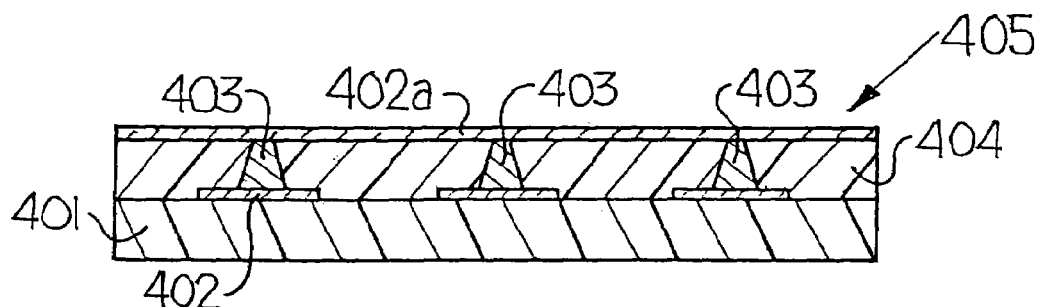
Figure 27C:
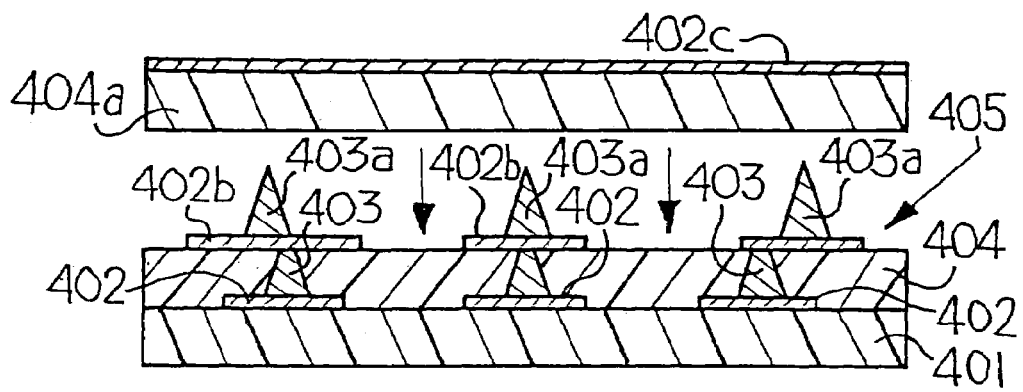
Figure 27D:
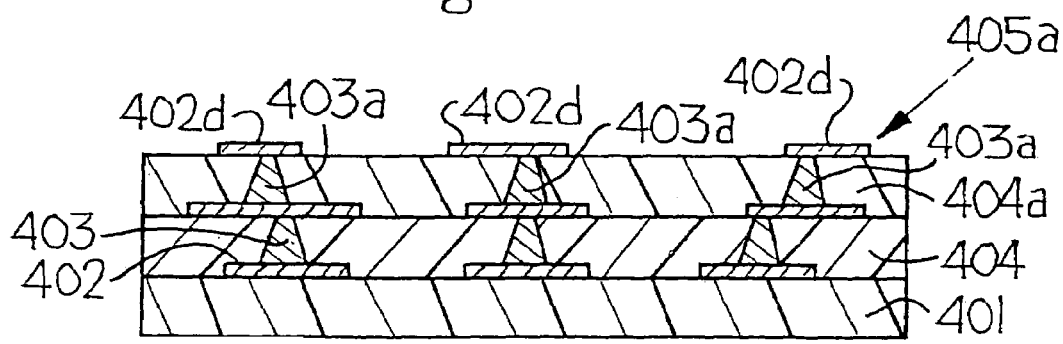

FIG. 24 is a group of vertical sectional views showing main points of the production of a multi-layer printed wiring board by laminating the unit boards of FIG. 23 together. FIG. 24(a) and FIG. 24(b) show a state before the laminating operation and a state after the laminating operation, respectively.

Referring to FIG. 24(a), four unit boards are located apart from one another, and the uppermost unit board 19 is identical with the unit board 219 shown in FIG. 23(e). Other three unit boards 219a, 219b and 219c are each identical with the uppermost unit board 219 except that the wiring pattern and the position of the through hole are different. The members of the unit boards 219a, 219b and 219c other than the uppermost unit board are designated as symbols consisting of reference numerals designating the members of the uppermost unit substrate and letters a, b and c, and description of each member is omitted herein. In the drawings, a unit board in which a wiring pattern 213 is previously formed is shown as the uppermost unit board 219, however, it is possible to laminate together four unit boards, of which only the uppermost unit board 219 has no wiring pattern, and then form a wiring pattern 213 on the uppermost unit board 219.

Among the four unit boards 219, 219a, 219b and 219c placed apart from one another, three insulating adhesive layers 220, 220a and 220b are arranged. The position of the left-side through hole 216 of the uppermost unit board 219 and the position of the left-side through hole 216a of the second unit board 219a are the same as each other; the position of the other through hole 216a of the second unit board 219a and the position of the left-side through hole 216b of the third unit board 219b are the same as each other; and the position of the other through hole 216b of the third unit board 219b and the position of the right-side through hole 216c of the lowermost unit board 219c are the same as each other.

The four unit boards and the three insulating adhesive layers are set in a pressing machine equipped with a heating/pressing/cooling mechanism, then press-bonded together with heating and pressing, and cooled with pressing. Thereafter, the laminate is taken out of the pressing machine to obtain a multi-layer printed wiring board 221 shown in FIG. 24(b).

In the multi-layer printed wiring board 221 thus obtained, the following electrical connection is made. The lower protrusion 218 of the conductor 217 in the left-side through hole 216 of the uppermost unit board 219 shown in FIG. 24(a) penetrates the uppermost insulating adhesive layer 220 and is united to the conductor 217a in the left-side through hole 216a of the second unit board 219a to form a new conductor (217+217a). By virtue of this new conductor, the wiring pattern 213 of the uppermost unit board 219 is electrically connected to the wiring patterns 213a and 213b of the second and the third unit boards 219a and 219b. Likewise, the protrusion 218a of the conductor 217a in the right-side through hole 216a of the second unit board 219a shown in FIG. 24(a) is united to the conductor 217b in the left-side through hole 216b of the third unit board 219b to form a new conductor (217a+217b). By virtue of this new conductor, the wiring pattern 213a of the second unit board 219a is electrically connected to the wiring patterns 213b and 213c of the third and the lowermost unit boards 219b and 219c. Likewise, a new conductor (217b+217c) is formed between the third and the lowermost unit boards 213b and 213c.

Even if a conductor is not united to another conductor like the conductor 217 in the right-side through hole 216 of the uppermost unit board 219 shown in FIG. 24a, the conductor penetrates the insulating adhesive layer 220 located beneath the conductor and comes into contact with the wiring pattern 213a of the second unit board 219a, whereby electrical connection is made between the uppermost unit board 219 and the second unit board 219a.

By adjusting the positions of the through holes formed in the unit boards as described above, variously shaped wiring patterns of plural unit boards can be electrically connected at their arbitrary positions. Moreover, plural unit boards can be laminated together without such labor of printing a conductive bump for each layer (each unit board) as in the conventional build-up process, and hence, the operational efficiency is greatly improved.

According to the present invention, formation of a via hole and filling thereof can be simultaneously made in a single pressing operation as described above. Hence, the production steps can be simplified and the cost reduction can be realized.

If a punched hole is previously formed in the resin sheet, the conductor chip can be readily and surely located in the punched hole in the second pressing operation.

The printed wiring board of the invention has high reliability about the electrical connection between the front and the back surface conductor layers. In the process of the invention, the steps are extremely simple as compared with those of the conventional plating or conductive paste printing process, and hence the cost reduction becomes feasible. In addition, since the printed wiring board can be produced by a dry process, no waste liquid is produced and recycling of used materials is feasible. Hence, the process of the invention is excellent from the viewpoint of environmental protection.

The printed wiring board of the invention is a printed wiring board comprising an insulating sheet having a wiring pattern on one or both surfaces and a conductor filled in a though hole that passes through the wiring pattern and the insulating sheet, wherein at least one end of the conductor protrudes from an aligned surface of the insulating sheet and/or the wiring pattern.

This printed wiring board is particularly useful as an intermediate of a multi-layer printed wiring board that is obtained by laminating plural printed wiring boards.

By laminating plural printed wiring boards through insulating adhesive layers and press-bonding them together, a multi-layer printed wiring board can be obtained.

In the multi-layer printed wiring board, the protrusion of the conductive material penetrates the insulating adhesive layer and comes into contact with the wiring pattern or the conductive material of the neighboring unit board, whereby desired electrical connection can be made among the neighboring unit boards, namely, all of the plural printed wiring boards laminated, and additionally, electrical connection between the upper and the lower wiring patterns of each unit board can be simultaneously attained when needed.

By properly determining the number and the positions of through holes filled with the conductive material in each unit board, a multi-layer printed wiring board having desired wiring patterns and electrical connection can be produced in a single press-bonding operation.

The process for producing a multi-layer printed wiring board according to the invention is a process comprising laminating plural printed wiring boards through insulating adhesive layers, each of said printed wiring boards comprising an insulating sheet having a wiring pattern on one or both surfaces and a through hole filled with a conductor, at least one end of which protrudes from the wiring pattern and/or the surface of the insulating sheet, and then press-bonding the plural printed wiring boards thus laminated to allow the protrusion of the conductor to penetrate the adhesive layer and come into contact with the wiring pattern and/or the conductive material of the neighboring printed wiring board so as to make an electrical connection between the neighboring wiring patterns.

According to the process of the invention, a multi-layer printed wiring board can be produced in a single press-bonding operation as mentioned above, so that the steps are extremely simple as compared with those of the conventional build-up process, and the cost reduction becomes feasible. In addition, since the multi-layer printed wiring board can be produced by a dry process, no waste liquid is produced and recycling of used materials is feasible. Hence, the process of the invention is excellent from the viewpoint of environmental protection.

In the process of the invention, formation of a through hole and filling of the through hole with the conductive material are desirably carried out by punching. By the punching, positioning can be made more accurately than by printing, so that the punching is suitable for attaining finer printed wiring boards recently required.

EXAMPLE

The present invention is further described with reference to the following examples.

Example 1

Production of Double-sided Metal TAB Tape

Using a double-sided copper-clad polyimide film of 36 mm width (trade name: Espanex, available from Shinnippon Kagaku Co., thickness of polyimide layer: 50 μm, thickness of copper foil on front or back surface: 18 μm), a so-called double-sided metal TAB tape having wiring layers on the front and back surfaces as shown in FIGS. 10 and 20 was produced in accordance with the steps for producing a double-sided metal TAB tape shown in FIG. 16. This tape had no electrical connection between the front and back surfaces.

Figure 21:
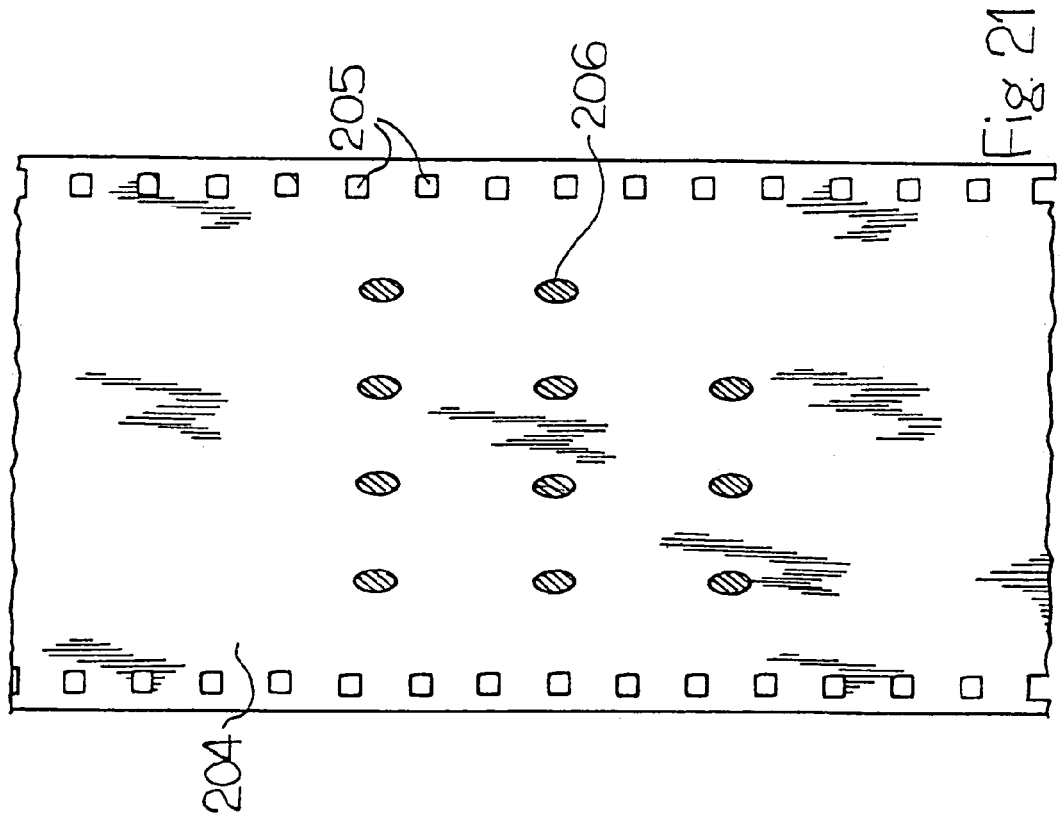
FIG. 21 is a perspective view of a double-sided metal TAB tape from its back surface.
Figure 19:
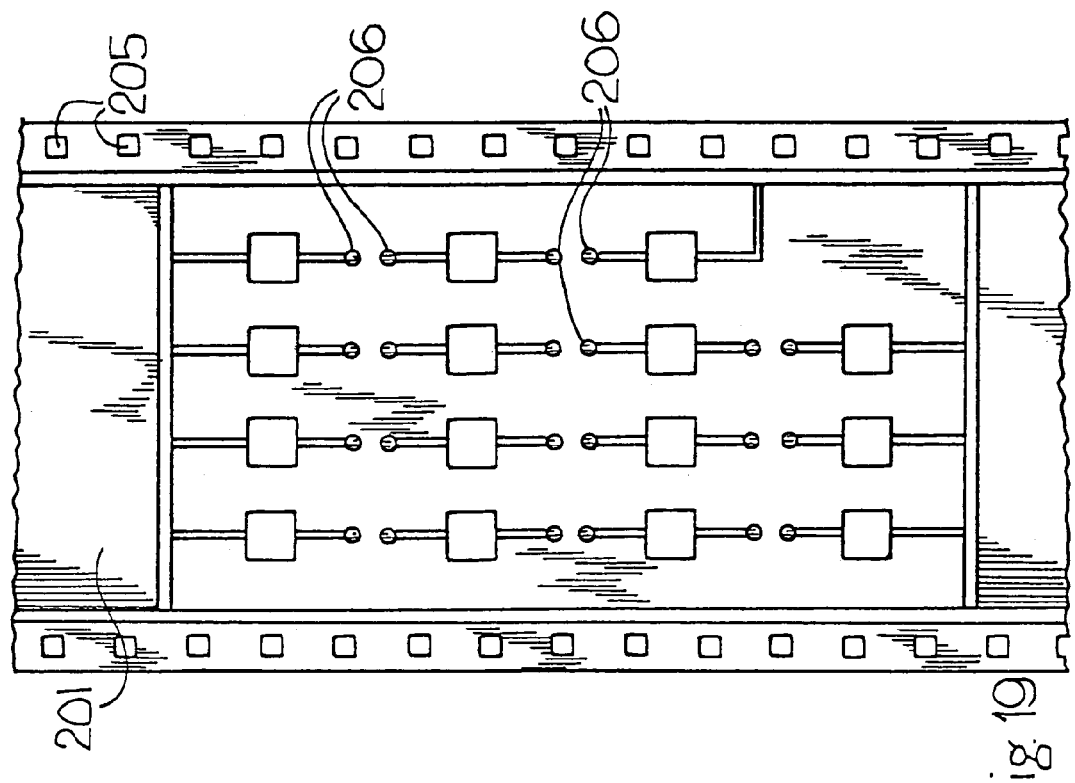
FIG. 19 is a view of a front surface of the double-sided metal TAB tape.

FIG. 19 is a view of a front surface of the double-sided metal TAB tape, and FIG. 20 is an enlarged view of a land and its vicinity on the front surface. FIG. 21 is a perspective view of a double-sided metal TAB tape from its back surface, and FIG. 22 is an enlarged view of a land and its vicinity on the back surface. Referring to FIGS. 19 to 22, numerals 204, 205 and 206 designate a double-sided metal TAB tape, a sprocket hole and a land, respectively. FIG. 21 is a perspective view, so that a wiring layer on the back surface is not shown. The term "land" used herein means a place where a through hole for filling therein a conductor is to be formed.

In the tape in which wiring layers had been formed on the front and back surfaces by etching or the like, through holes were formed at the positions shown in FIGS. 19 and 21 using a punching press machine. Subsequently, a solder plate having a thickness of 95 μm was superposed on the tape and subjected to punching pressing to embed (fill) the solder in the through holes. Then, pressing was performed using a pressing machine to make electrical connection between the front and back surface wiring layers. In the obtained tape, ideal contact was observed between the wiring layer and the conductor as shown in FIG. 17 that is a schematic sectional view of a hole having a diameter of, for example, 200 μm. Moreover, a conductivity (<10 mΩ/hole) sufficient for a double-sided metal TAB tape was obtained for any through hole.

Example 2

Production of Double-sided Metal TAB Tape

A double-sided metal TAB tape was obtained in the same manner as in Example 1, except that embedding (filling) of the conductor in the trough holes was carried out not after the formation of wiring layers by etching or the like but simultaneously with the formation of sprocket holes after the through holes were previously formed. Similarly to Example 1, a conductivity (<10 mΩ/hole) sufficient for a double-sided metal TAB tape was obtained for any through hole.

Example 3

Production of Double-sided Metal TAB Tape

A double-sided metal TAB tape was obtained in the same manner as in Example 1, except that the through holes were not formed previously, and formation of through holes by a punching press and embedding (filling) of solder were simultaneously carried out, followed by pressing. That is, embedding of solder was carried out simultaneously with the formation of through holes by a punching press. As a result, disconnection was partly observed between the wiring layer and the conductor as shown in FIG. 18 that is a schematic sectional view of a hole having a diameter of, for example, 200 μm, however, the connection could be recovered by reflowing.

Example 4

Production of Double-sided Metal TAB Tape

A double-sided metal TAB tape was obtained in the same manner as in Example 2, except that the through holes were not formed previously, and formation of through holes by a punching press and embedding (filling) of solder were simultaneously carried out, followed by pressing. That is, embedding of solder was carried out simultaneously with the formation of through holes and sprocket holes by a punching press. As a result, disconnection was partly observed between the wiring layer and the conductor as shown in FIG. 18 that is a schematic sectional view of a hole having a diameter of, for example, 200 μm, however, the connection could be recovered by reflowing.

Example 5

An example of a process for producing a multi-layer printed wiring board in the manner shown in FIG. 23 and FIG. 24 is described below.

In a two-layer type CCL consisting of a polyimide resin film of 25 μm thickness and wiring patterns of copper layers formed on both surfaces of the resin film, 400 through holes of 0.1 mm diameter were formed using a die and a pressing machine. On the CCL, a conductive metal sheet made of high-temperature solder was placed, and the metal sheet was punched by the use of the die so to embed the copper in the through holes that one end of the copper on the upper surface side of the CCL was flush with the CCL and the other end of the copper on the lower surface side of the CCL protruded from the CCL by about 100 μm. Thus, a unit board was prepared.

Four of the unit boards were laminated through three thermosetting adhesive layers (prepreg) each having a thickness of about 40 μm and containing no glass fiber. The laminated unit boards were set on a press having a heating/pressing/cooling mechanism, then heated and pressed at 150° C. and 2 atm for 10 minutes to bond them together, and cooled to room temperature over a period of 10 minutes with pressing.

In the multi-layer printed wiring board thus obtained, the electrical resistance between the wiring patterns on the upper and the lower surfaces of the unit board and the electrical resistance between the wiring patterns of the unit boards which were adjacent to each other through the adhesive layer were each a low resistance of 2 mΩ on an average.

In order to examine reliability about the electrical connection, the resulting multi-layer printed wiring board was immersed in an oil at 260° C. for 10 seconds and then immersed in an oil at 20° C. for 20 seconds. These operations were taken as one cycle, and 100 cycles were repeated. Even after the test, no failure occurred in the multi-layer printed wiring board, and reliability of the multi-layer printed wiring board was confirmed.

What is claimed is:

1. A process for producing a collapsed filled via hole comprising placing an insulating resin sheet with or without a conductive material sheet on at least one surface of the resin sheet, and a conductive metal sheet having a thickness larger than the resin sheet in this order on a die hole provided in a metal mold;

punching the conductive metal sheet with a punch that does not reach the resin sheet thereby producing a chip of the conductive metal, the chip of conductive metal is pressed into the resin sheet by the punch, whereby a through hole is formed in the resin sheet and the chip is inserted and remains in the through hole to form a filled via hole with a first end and a second end; and collapsing the first end and the second end of the filled via hole to externally spread like an umbrella thereby producing the collapsed filled via hole, wherein the chip of conductive metal protrudes from both surfaces of the resin sheet by 10 to 500 μm.

2. A process for producing a collapsed filled via hole comprising placing an insulating resin sheet with or without a conductive material sheet on at least one surface of the resin sheet having a through hole, and a conductive metal sheet having a thickness larger than the resin sheet in this order on a die hole provided in a metal mold;

punching the conductive metal sheet with a punch of substantially the same size as the through hole and set over the position corresponding to the hole thereby producing a chip of the conductive metal, the chip of conductive metal is pressed into the resin sheet by the punch to form a filled via hole with a first end and second end, whereby the chip is inserted and remains in the through hole, wherein the punch does not reach the resin sheet; and collapsing the first end and the second end of the filled via hole to externally spread like an umbrella thereby producing the collapsed filled via hole, wherein the chip of conductive metal protrudes from both surfaces of the resin sheet by 10 to 500 μm.

3. A process for producing the collapsed via hole according to claim 1, wherein the insulating resin sheet is made of at least one material selected from the group consisting of polyimide, polyester, polypropylene, polyphenylene sulfide, polyvinylidene chloride, ethylene-vinyl alcohol copolymer, and bismaleimide triazine (BT) resin, and the conductive metal is at least one conductive metal selected from the group consisting of a solder sheet, a solder-plated metal sheet and a copper alloy sheet.

4. A process for producing the collapsed via hole according to claim 2, wherein the insulating resin sheet is made of at least one material selected from the group consisting of polyimide, polyester, polypropylene, polyphenylene sulfide, polyvinylidene chloride, ethylene-vinyl alcohol copolymer, and bismaleimide triazine (BT) resin, and the conductive metal is at least one conductive metal selected from the group consisting of a solder sheet, a solder-plated metal sheet and a copper alloy sheet.

5. A process for producing a collapsed filled via hole comprising:

(A) placing an insulating resin sheet, optionally including a conductive material sheet on at least one surface of the resin sheet, in a die hole provided in a metal mold;

(B) placing a conductive metal sheet having a thickness larger than the resin sheet in the die hole;

(C) punching the resin sheet in (A) and the metal sheet in (B) with a punch that does not reach the resin sheet thereby producing a chip of the metal sheet in (B), the chip of the metal sheet in (B) is pressed into the resin sheet in (A) by the punch, whereby a through hole is formed in the resin sheet in (A) and the chip is inserted and remains in the through hole to form a filled via hole with a first end and a second end; and (D) collapsing the first end and the second end of the filled via hole to externally spread like an umbrella thereby producing the collapsed filled via hole, wherein the chip of conductive metal protrudes from both surfaces of the resin sheet by 10 to 500 μm.

6. The process of claim 5, wherein the resin sheet in (A) is made of at least one material selected from the group consisting of polyimide, polyester, polypropylene, polyphenylene sulfide, polyvinylidene chloride, ethylene-vinyl alcohol copolymer, and bismaleimide triazine (BT) resin.

7. The process of claim 5, wherein the conductive metal sheet in (B) comprises one or more metals selected from the group consisting of a solder sheet, a solder-plated metal sheet and a copper alloy sheet.

8. The process of claim 5, wherein a conductive material layer is formed on at least one surface of the insulating resin sheet and the conductive material layer and the conductive metal chip are connected electrically with each other.

* * * * *

UNITED STATES PATENT AND TRADEMARK OFFICE
CERTIFICATE OF CORRECTION

PATENT NO. : 7,178,233 B2
APPLICATION NO. : 10/728177
DATED : February 20, 2007
INVENTOR(S) : Nakamura et al.

It is certified that error appears in the above-identified patent and that said Letters Patent is hereby corrected as shown below:

Column 32, Line 11, Claim 5, "punching the resin sheet in (A) and the" should read -- punching the metal sheet in (B) with --

Signed and Sealed this

Twelfth Day of June, 2007

JON W. DUDAS
*Director of the United States Patent and Trademark Office*